(12) United States Patent
Yacoub-George et al.

(10) Patent No.: US 11,574,858 B2
(45) Date of Patent: Feb. 7, 2023

(54) FOIL-BASED PACKAGE WITH DISTANCE COMPENSATION

(71) Applicant: Fraunhofer-Gesellschaft zur Förderung der angewandten Forschung e.V., Munich (DE)

(72) Inventors: Erwin Yacoub-George, Munich (DE); Waltraud Hell, Munich (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/800,932

(22) Filed: Feb. 25, 2020

(65) Prior Publication Data

US 2020/0279801 A1 Sep. 3, 2020

(30) Foreign Application Priority Data

Feb. 28, 2019 (DE) .......................... 102019202715.6

(51) Int. Cl.
*H01L 23/498* (2006.01)
*H01L 23/18* (2006.01)
(Continued)

(52) U.S. Cl.
CPC .... *H01L 23/49833* (2013.01); *H01L 21/4803* (2013.01); *H01L 21/56* (2013.01);
(Continued)

(58) Field of Classification Search
CPC ................. H01L 21/4803; H01L 21/56; H01L 23/49833; H01L 23/18; H01L 23/3121;
(Continued)

(56) References Cited

U.S. PATENT DOCUMENTS

| 3,563,358 A | 2/1971 | Lindeberg et al. |
| 5,956,232 A | 9/1999 | Joerg et al. |

(Continued)

FOREIGN PATENT DOCUMENTS

| CN | 103219314 A | 7/2013 |
| DE | 195 00 655 A1 | 7/1996 |

(Continued)

OTHER PUBLICATIONS

"JEDEC Standard MO-220".
(Continued)

*Primary Examiner* — Andres Munoz
(74) *Attorney, Agent, or Firm* — Perkins Coie LLP; Michael A. Glenn

(57) ABSTRACT

A foil-based package and a method for manufacturing a foil-based package includes, among other things, a first and a second foil substrate. An electronic component is arranged between the two foil substrates in a sandwich-like manner. Due to the component thickness, there is a distance difference between the two foil substrates between the mounting area of the component and ears outside of the mounting area. The foil-based package and the method provides means for reducing and/or compensating a distance difference between the first foil substrate and the second foil substrate caused by the component thickness.

12 Claims, 8 Drawing Sheets

(51) Int. Cl.
*H01L 23/552* (2006.01)
*H01L 23/31* (2006.01)
*H01L 21/48* (2006.01)
*H01L 21/56* (2006.01)
*H01L 23/00* (2006.01)

(52) U.S. Cl.
CPC .............. *H01L 23/18* (2013.01); *H01L 23/315* (2013.01); *H01L 23/3121* (2013.01); *H01L 23/49838* (2013.01); *H01L 23/49855* (2013.01); *H01L 23/552* (2013.01); *H01L 24/08* (2013.01); *H01L 2224/08225* (2013.01)

(58) Field of Classification Search
CPC .............. H01L 23/315; H01L 23/49838; H01L 23/49855; H01L 23/552; H01L 23/13; H01L 23/3171; H01L 23/3185; H01L 23/4985; H01L 23/3164; H01L 24/08; H01L 24/16; H01L 2924/16195; H01L 2924/16152; H01L 2924/16196; H01L 2224/08225; H01L 2224/131; H01L 2224/13147; H01L 2224/16238; H01L 2224/50

See application file for complete search history.

(56) References Cited

U.S. PATENT DOCUMENTS

| | | | |
|---|---|---|---|
| 6,154,366 | A | 11/2000 | Ma et al. |
| 6,492,203 | B1 | 12/2002 | Wakashima et al. |
| 6,617,193 | B1 | 9/2003 | Toshio et al. |
| 9,018,742 | B2 | 4/2015 | Joachim et al. |
| 9,692,009 | B2 | 6/2017 | Lang et al. |
| 2001/0019179 | A1 | 9/2001 | Yoshino et al. |
| 2002/0121707 | A1 | 9/2002 | Pendse et al. |
| 2003/0035275 | A1 | 2/2003 | Kopf |
| 2003/0057525 | A1 | 3/2003 | Fock et al. |
| 2004/0119166 | A1 | 6/2004 | Sunohara |
| 2004/0232528 | A1 | 11/2004 | Ito et al. |
| 2005/0087847 | A1 | 4/2005 | Kuan et al. |
| 2005/0127503 | A1 | 6/2005 | Gobi et al. |
| 2007/0267740 | A1 | 11/2007 | Khan et al. |
| 2008/0244902 | A1 | 10/2008 | Blackwell et al. |
| 2009/0096083 | A1 | 4/2009 | Augustin et al. |
| 2009/0127638 | A1 | 5/2009 | Kilger et al. |
| 2011/0133341 | A1 | 6/2011 | Shimizu et al. |
| 2011/0233771 | A1 | 9/2011 | Kwon et al. |
| 2012/0091594 | A1 | 4/2012 | Landesberger et al. |
| 2012/0168920 | A1 | 7/2012 | Tan et al. |
| 2013/0026650 | A1 | 1/2013 | Yamagata et al. |
| 2013/0187259 | A1 | 7/2013 | Nikitin et al. |
| 2013/0313727 | A1 | 11/2013 | Goh et al. |
| 2014/0008777 | A1 | 1/2014 | Loh et al. |
| 2015/0207101 | A1 | 7/2015 | Lang et al. |
| 2015/0221842 | A1 | 8/2015 | Mima et al. |
| 2015/0243642 | A1 | 8/2015 | Chen et al. |
| 2015/0294931 | A1* | 10/2015 | Brucchi ............... H01L 24/32 361/761 |
| 2016/0374208 | A1 | 12/2016 | Chiang et al. |
| 2017/0125881 | A1 | 5/2017 | Mangrum et al. |
| 2017/0207524 | A1 | 7/2017 | Cardinali et al. |
| 2017/0236776 | A1 | 8/2017 | Huynh et al. |
| 2018/0108616 | A1 | 4/2018 | Chiang et al. |
| 2018/0300597 | A1 | 10/2018 | Ng et al. |
| 2020/0014113 | A1 | 1/2020 | Asaka |
| 2020/0279797 | A1 | 9/2020 | Faul |
| 2020/0279801 | A1* | 9/2020 | Yacoub-George ......... H01L 23/4985 |
| 2021/0159302 | A1* | 5/2021 | Choi ............... H01L 27/3276 |

FOREIGN PATENT DOCUMENTS

| | | |
|---|---|---|
| DE | 195 42 883 C2 | 1/2002 |
| DE | 102006044525 B3 | 1/2008 |
| DE | 10 2010 042 567 B2 | 3/2012 |
| DE | 10 2013 100 339 A1 | 7/2013 |
| DE | 102012 214411 A1 | 2/2014 |
| DE | 10 2014 208 958 A1 | 11/2015 |
| EP | 0920056 A2 | 6/1999 |
| EP | 1028463 A1 | 8/2000 |
| EP | 1256983 A2 | 11/2002 |
| EP | 1895585 A2 | 3/2008 |
| EP | 2040295 A2 | 3/2009 |
| EP | 2268110 A1 | 12/2010 |
| EP | 1548829 B1 | 10/2011 |
| JP | 2001291893 A | 10/2001 |
| WO | 2015/173032 A1 | 4/2015 |
| WO | 2015/173031 A1 | 11/2015 |

OTHER PUBLICATIONS

"Quad Flat No-leads package", printout of https://de.wikipedia.org/wiki/Quad_Flat_No_Leads_Package (engl. version).

* cited by examiner

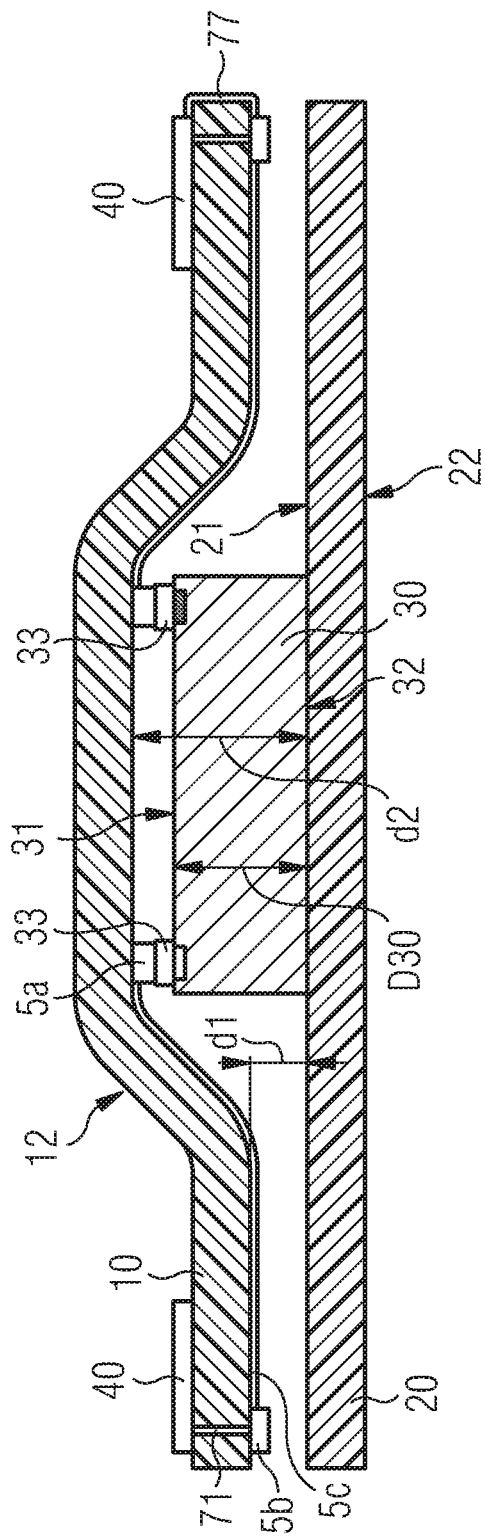
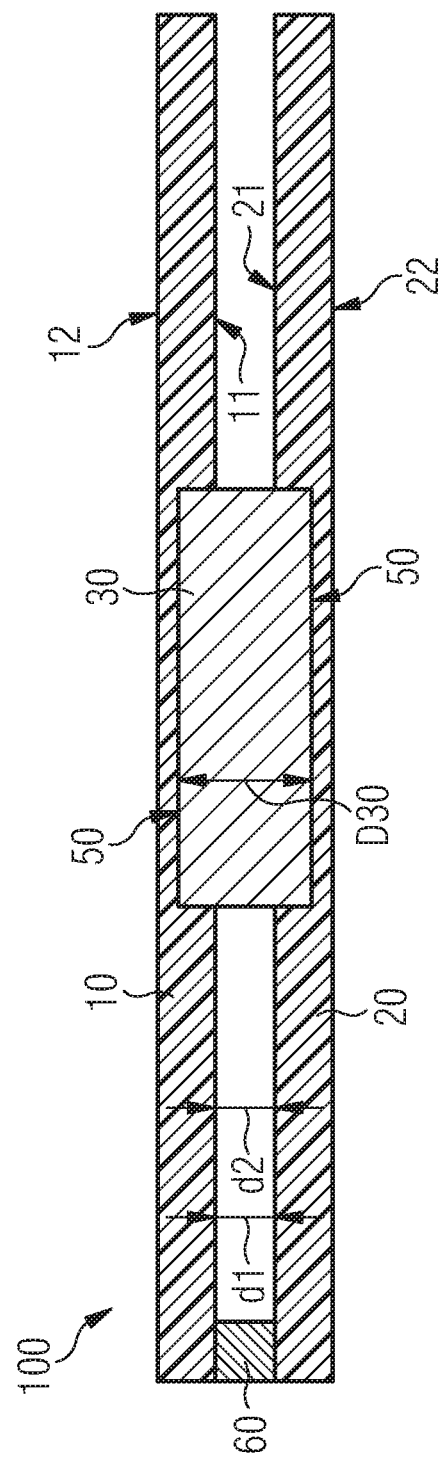

FOIL-BASED PACKAGE WITH DISTANCE COMPENSATION

CROSS-REFERENCE TO RELATED APPLICATION

This application claims priority from German Patent Application No. DE 10 2019 202 715.6, filed on Feb. 28, 2019, and is incorporated herein in its entirety by reference.

BACKGROUND OF THE INVENTION

The invention concerns a foil-based package for housing an electronic component, and in particular an ultra-thin chip-foil package for semiconductor chips.

Packages are often also referred to as housings or chip housings and concern an encapsulation of an electronic component, usually a semiconductor chip, including external terminal points, so-called terminal pads, for mounting, connecting and electrically contacting the electronic component located in the package.

Highly developed packages of the next generation, co-called advanced packages, are designed to meet the demands of the industry and the market to continuously reduce the size and, above all, the structural height of electronic assemblies while simultaneously increasing their performance and reducing costs. The resulting demands on the semiconductor chips are reflected in the continuously increasing number of I/O (input/output) pads, which, with the size of the semiconductor chips remaining unchanged, may only be realized through a reduced pitch. This so-called pad pitch refers to the distance between two I/O pads, measured from a mean width of the I/O pads. Electrically contacting such semiconductor chips with a large number of small I/O pads in a very small space is becoming increasingly difficult, even with the latest wire bonding technologies. At the same time, increasingly large amounts of heat often have to be dissipated and higher electrical currents have to be transferred.

The industry meets these requirements by developing wafer level packages (e.g. wafer level chip scale package WL-CSP or fan-out wafer level packages) on the one hand and by increasing the integration density by means of flip-chip assemblies on the other hand. New methods and technologies for the flip-chip assembly (e.g. Cu pillar) play an important role in this regard. A favorite future technology approach is to assemble semiconductor chips directly, i.e. in unpackaged form, on the printed circuit board (chip on board (COB)). However, for various and technical and economic reasons (yield, reliability, bonding tools and materials), this technology is only competitive in niche applications.

Generally, electronic components are installed in standardized housings (e.g. SMD, surface mount device) with the package-based production techniques (pick and place, tape and reel) of the printed circuit board industry.

In a conventional modern semiconductor package, the semiconductor chip is assembled on a functional carrier substrate (lead frame) and is often provided with a protective cover. In these packages, the contact between the chip and the carrier is often realized by wire bonds. For geometric reasons, the structural height of packages with internal wire bond connections may only be reduced up to the minimum bending radius of the bond wire due to the routing of the bond wire. The package is then typically mounted and contacted (e.g. by reflow soldering, thermo-compression bonding, conductive adhesion) on a printed circuit board by means of automatic placement machines, with the terminal pads being located on the bottom side of the package.

US publication US 2002/121 707A is cited as the conventional technology, describing a flip-chip package in which the chip is located on the same side of the package substrate as the solder balls for contacting the package on a circuit board.

Furthermore, patent DE 10 2010 042 567 is cited as the conventional technology, wherein a semiconductor chip fixed on a substrate is enclosed by a polymer mass. The polymer mass is opened in the area of the terminal pads of the semiconductor chip and a metallization plane is created for electrically contacting the chip on the polymer surface.

A basically similar procedure is described in German patent DE 195 00 655 A1, wherein a chip is fixed on a substrate and is subsequently encapsulated.

German patent DE 195 42 883 C2 describes a chip housing made of two flexible sheets with conductive paths, wherein a recess is generated by deforming the sheets.

The packages known from the conventional technology have a large package thickness which, however, contradicts the demand for ever smaller packages, e.g. for the integration into smartphones. In order to reduce the size, the conventional technology proposes packages that are based on foil substrates. As described in DE 195 42 883 C2, two foils may be placed around a chip at the top and the bottom. This results in a candy-shaped structure with two thin ends on the left and the right sides where the foils lie on top of each other, and a thick part in the middle where the chip is arranged. This means that, due the thickness of the component, there is a larger distance between the two foils in the middle than at the lateral thin ends where the foils lie directly on top of each other. This means that there are distance differences between the two foils in different areas of the package.

In principle, this is a very good approach for reducing the size of packages. However, this package shape has proven to be hard to handle in practice. Due to the alternating thick and thin areas, a corresponding unevenness results on the outside of the package. These packages can therefore only be used very circumstantially in the well-established fully automated package-based standard assembly process (pick and place) of the industry.

It would therefore be desirable to improve known packages by designing them to be as thin as possible so that they are comparable to chip-on-board (COB) technologies, but can be used with established fully-automated package-based standard assembly processes (pick and place) of the industry at the same time.

SUMMARY

According to an embodiment, a foil-based package may have: a first foil substrate with a first main side and an opposite second main side, wherein a multitude of electrical contact elements are arranged on the first main side, wherein each contact element has a first contact portion and a second contact portion laterally spaced apart therefrom, wherein the first and second contact portions of a contact element are galvanically connected to each other by means of a connecting portion, a second foil substrate with a first main side and an opposite second main side, an electronic component with a first component side and an opposite second component side, wherein a multitude of component terminal pads for electrically contacting the component are arranged on the first component side, and wherein the electronic component has a component thickness to be measured between the first and second component sides, wherein the first foil substrate and the second foil substrate are arranged on top of each other such that the first main side of the first foil substrate and the first main side of the second foil substrate are opposite to each other, wherein the electronic component is arranged between the first foil substrate and the second foil substrate such that at least some of the multitude of the component terminal pads are connected to a respective one of the first contact portions of the contact elements arranged on the first main side of the first foil substrate, wherein the respective second contact portion of the contact elements connected to the component terminal pads is connected to a respective one of a multitude of package-externally arranged package terminal pads for electrically contacting the foil-based package, and wherein the foil-based package has means for reducing and/or compensating a distance difference between the first foil substrate and the second foil substrate caused by the component thickness.

According to another embodiment, a method for manufacturing a foil-based package may have the steps of: providing a first foil substrate with a first main side and an opposite second main side, wherein a multitude of electrical contact elements are arranged on the first main side, wherein each contact element has a first contact portion and a second contact portion arranged laterally spaced apart therefrom, wherein the first and second contact portions of a contact element are galvanically connected to each other by means of a connecting portion, providing a second foil substrate with a first main side and an opposite second main side, introducing a cavity into the second foil substrate such that the cavity extends starting from the first main side towards the second main side of the second foil substrate, providing an electronic component with a first component side and an opposite second component side, wherein a multitude of component terminal pads for electrically contacting the component are arranged on the first component side, and wherein the electronic component has a component thickness to be measured between the first and second component sides, and arranging the components on the first main side of the first foil substrate such that at least some of the multitude of component terminal pads are connected to a respective one of the first contact portions of the contact elements, and arranging the first foil substrate on the second foil substrate such that the component is placed into the cavity, and such that the first main side of the first foil substrate and the first main side of the second foil substrate are opposite to each other and cover the electronic component arranged in the cavity on both sides.

According to another embodiment, a method for manufacturing a foil-based package may have the steps of: providing a first foil substrate with a first main side and an opposite second main side, wherein a multitude of electrical contact elements are arranged on the first main side, wherein each contact element has a first contact portion and a second contact portion arranged laterally spaced apart therefrom, wherein the first and second contact portions of a contact element are galvanically connected to each other by means of a connecting portion, providing a second foil substrate with a first main side and an opposite second main side, arranging at least two spacer elements between the first main side of the first foil substrate and the first main side of the second foil substrate, wherein a first spacer element is connected to one of the second contact portions of one of the contact elements, and wherein a second spacer element is connected to one of the second contact portions of another one of the contact elements, providing an electronic component with a first component side and an opposite second component side, wherein a multitude of component terminal pads for electrically contacting the component are arranged on the first component side, and wherein the electronic component has a component thickness to be measured between the first and the second component sides, arranging the component on the first main side of the first foil substrate such that some of the multitude of the component terminal pads are connected to a respective first contact portion of the contact elements arranged on the first main side of the first foil substrate, and arranging the first foil substrate on the second foil substrate such that the first main side of the first foil substrate and the first main side of the second foil substrate are opposite to each other and cover the electronic component on both sides, and such that the spacer elements keep the first main side of the first foil substrate and the first main side of the second foil substrate spaced apart from each other.

Among other things, the inventive foil-based package comprises a first foil substrate with a first main side and an opposite second main side. A multitude of electrical contact elements are arranged on the first main side, wherein each contact element respectively comprises a first contact portion and a second contact portion laterally spaced apart therefrom, wherein the respective first and second contact portions of a contact element are galvanically connected by means of a connecting portion. The foil-based package further comprises a second foil substrate with a first main side and an opposite second main side. In addition, the foil-based package comprises an electronic component with a first component side and an opposite second component side, wherein a multitude of component terminal pads are arranged on the first component side for electrically contacting the component, and wherein the electronic component comprises a component thickness to be measured between the first and the second component sides. The first foil substrate and the second foil substrate are arranged on top of each other so that the first main side of the first foil substrate and the first main side of the second foil substrate are opposite to each other. The electronic element is arranged in a sandwich-like manner between the first foil substrate and the second foil substrate so that at least some of the multitude of the component terminal pads are connected to a respective one of the first contact portions of the contact elements arranged on the first main side of the first foil substrate. In addition, the respective second contact portion of the contact elements connected to the component terminal pads is connected to a respective one of a multitude of package-externally arranged package terminal pads for electrically contacting the foil-based package. According to the invention, the foil-based package comprises means (or a unit or a device) for reducing and/or compensating a distance difference $\Delta d$ between the first foil substrate and the second foil substrate caused by the component thickness.

For example, such a distance difference $\Delta d$ between the two foil substrates results due to the component enclosed in a sandwich-like manner between the two foil substrates. The inventive concept provides appropriate means for compensating, or at least reducing, such a distance difference. That is, a package without the inventive means for reducing and/or compensating the distance difference $\Delta d$ comprises a distance difference $\Delta d$ between the two foil substrates. On the other hand, a package comprising the inventive means for reducing and/or compensating the distance difference $\Delta d$ may compensate or at least reduce said distance difference $\Delta d$ (in contrast to packages without the inventive means). In particular, a full compensation of the distance difference $\Delta d$ may be desired, since this may also avoid an external unevenness. This enables handling by means of conventional standard processes (e.g. pick and place). Nevertheless, the package itself remains thin. A further advantage is that the structure and the manufacturing process of the inventive package are significantly simplified compared to the conventional technology. For example, there is no need to apply a casting compound on the outside, which additionally has to be planarized. Thus, compared to the conventional technology, some method steps may be omitted.

According to a conceivable embodiment, the means for reducing and/or compensating the distance difference Δd comprise a cavity that is introduced into one of the two foil substrates. For example, this cavity may be generated by removing a foil substrate material of the respective foil substrate. The thickness of the respective foil substrate is reduced at this location, i.e. the location where the cavity is introduced, relative to the remaining foil thickness. For example, the cavity may be introduced in the second foil substrate. According to this embodiment, it would be conceivable for the means for reducing and/or compensating the distance difference Δd to comprise a cavity formed in the second foil substrate, wherein the second foil substrate comprises a foil thickness to be measured between its first and second main sides, wherein the cavity extends in the second foil substrate from its first main side to its second main side so that the second foil substrate comprises a reduced foil thickness at this location, and wherein the electronic component is arranged within this cavity. By arranging the component in the cavity, the thickness of the package may be significantly reduced.

In a further conceivable embodiment, according to a first package type, the first foil substrate comprises package terminal pads routed to the outside. Thus, according to such an embodiment, the multitude of package terminal pads may be arranged at the second main side of the first foil substrate, wherein a galvanic connection is realized between a respective one of the second contact portions and one of the package terminal pads by means of a via extending through the first foil substrate. Thus, the electronic component may be contacted from the outside from the second main side of the first foil substrate in terms of a flip-chip assembly arrangement.

This first package type is characterized by a signal path that is traversed by a signal in the following order: starting from one of the multitude of component terminal pads, the signal path extends by way of one of the connected first contact portions of a contact element, subsequently by way of the connecting portion connecting the respective first and second contact portions of this contact element, subsequently by way of the respective second contact portion of the contact element and subsequently by way of a via connected to the second contact portion and extending through the first foil substrate to one of the package terminal pads connected to this via. This results in a direct signal routing with the shortest possible paths. For example, the contact elements may be arranged in terms of a fan-out wiring, wherein the first contact portion is located opposite to the component terminal pads, and wherein the second contact portion is routed laterally towards the outside. The length of the connection element between the first and second contact portions defines the distance between the two contact elements and therefore determines the extent to which the second contact portion is routed laterally towards the outside in contrast to the component terminal pads.

As an alternative to the above mentioned first package type, wherein the component is flipped once with respect to the package terminal pads, a second package type is proposed, wherein the component is flipped twice with respect to the package terminal pads. Both package types may be mounted using a surface mounting technique, for example, the inventive second package type may be a SMD-compliant (SMD=surface mount device) package type. According to such an embodiment, the multitude of package terminal pads may be arranged at the second main side of the second foil substrate, wherein a galvanic connection is realized between a respective one of the second contact portions on the first main side of the first foil substrate and one of the package terminal pads on the second main side of the second foil substrate by means of a via extending through the second foil substrate. Through this, following a standardization (e.g. SMD), the electronic component may be contacted from the outside from the second main side of the second foil substrate.

The above-described SMD-compliant second package type is characterized by signal path that is traversed by a signal in the following order: Starting from one of the multitude of component terminal pads, the signal path extends by way of one of the connected first contact portions of a contact element, subsequently by way of the connecting portion connecting the respective first and second contact portions of this contact element, subsequently by way of the respective second contact portion of the contact element and subsequently by way of a via connected to the second contact portion and extending through the second foil substrate to a package terminal pad connected to this via. This results in a wiring that may adhere to certain standards and specifications to place the package onto different carrier substrates according to the respective standard. In this embodiment, the contact elements may also be arranged in terms of a fan-out wiring, wherein the respective first contact portion is located opposite to the component terminal pads, and wherein the second contact portion is routed laterally towards the outside. The length of the connection element between the first and second contact portions defines the distance between the two contact elements and therefore determines the extent to which the second contact portion is routed laterally towards the outside in contrast to the component terminal pads. Accordingly, the second contact portions may be arranged, placed and dimensioned in a standard-compliant manner.

As initially mentioned, the cavity is configured to reduce or compensate a distance difference Δd between the two foil substrates. For example, the distance difference Δd may be compensated due to the fact that the cavity has a depth that is at least equal to the thickness of the component. According to such an embodiment, the cavity may comprise a depth H to be measured between the first and second main sides of the second foil substrate, wherein this depth H of the cavity is larger than or as large as the component thickness of the electronic component arranged therein including the component terminal pads. If the depth H of the cavity is the same as the component thickness, the component fits into the cavity with clearance. In both cases, the component may be fully arranged in the cavity so that there is no distance difference Δd between the two foil substrates. Thus, the cavity would be configured to compensate the distance difference Δd. In other conceivable embodiments, the depth H of the cavity may be smaller than the component thickness. In this case, the component could be partially arranged in the cavity, i.e. with a certain protrusion with respect to the first main side of the second foil substrate. This could at least reduce the distance difference Δd between the two foil substrates (in contrast to foil substrates without a cavity). In this case, the cavity would be configured to at least reduce the distance difference.

An advantage of the inventive foil-based package results from the extreme thinness of the package. Foil substrates are significantly thinner than conventional rigid substrates such as PCBs (printed circuit boards). Among other things, the foil substrates are flexible and may be reversibly deformed. The electronic component may also have a component thickness that is so small that the component also behaves flexibly and is reversibly deformable. Thus, the entire inventive foil-based package may be flexible and reversibly deformable. For example, this may be advantageous in applications such as SmartCards© and the like. According to embodiments, the foil thickness of the second foil substrate may be smaller than or equal to 130 µm, or smaller than or equal to 100 µm, or smaller than or equal to 50 µm. The component thickness of the component including the component terminal pads may be smaller than or equal to 60 µm, or smaller than or equal to 50 µm, or smaller than or equal to 40 µm. An inventive package having dimensions in this range may be particularly well suited for use on electrical circuit carriers that are being permanently or repeatedly mechanically deformed.

According to a further conceivable embodiment, the first foil substrate may comprise a foil thickness to be measured between its first and second main sides, and the reduced foil thickness of the second foil substrate may be as large as the foil thickness of the first foil substrate. Adjusting the foil thicknesses of the first and second foil substrates and the depth of the cavity in the second foil substrate makes it possible to place the component in the final package into the neutral zone of the package. The neutral zone is characterized in that the foil substrates each comprise the same foil thickness above and below the component. This significantly reduces the mechanical stress acting on the component when bending the package.

Alternatively or additionally to the cavity described above, the inventive means for reducing and/or compensating the distance difference Δd may comprise one or several spacer elements, so-called spacers. These spacers are arranged between the two foil substrates and generate a distance between the first and second foil substrate that corresponds to the spacer thickness. This makes it possible to reduce or compensate a distance difference Δd between the areas in which the component is arranged and the areas that are spaced apart from the component. According to a conceivable embodiment, the means for reducing and/or compensating the distance difference Δd may comprise at least two spacer elements arranged between the first and second foil substrates and extending fully through a gap between the first main side of the first foil substrate and the first main side of the second foil substrate and being configured to create an equal distance between the first main side of the first foil substrate and the first main side of the second foil substrate. In this context, "to fully extend through" means that the spacer elements advantageously continuously extend through the gap and fill out the gap across their entire cross-section. The spacer elements advantageously extend through the gap perpendicularly to the main extension direction of the foil substrates. For example, the spacer elements may come into contact with the first main side of the first foil substrate (or with elements arranged thereon, such as the contact elements) and/or with the second main side of the second foil substrate (or with elements arranged thereon).

Advantageously, the spacer elements may be dimensioned such that they set the distance between the two foil substrates in such a way that it is as large as the component thickness. This makes it possible to compensate a distance difference Δd between the two foil substrates caused by the component thickness such that a distance between the two foil substrates in the area of the mounted component is as large as in areas that are spaced apart from the mounted component. According to a conceivable embodiment, the spacer elements may therefore be dimensioned such that the distance between the first main side of the first foil substrate and the first main side of the second foil substrate is larger than or equal to the component thickness of the electronic component including the component terminal pads. This would allow to compensate the distance difference Δd. According to a further conceivable embodiment, the spacer elements may be dimensioned such that the distance between the first main side of the first foil substrate and the first main side of the second foil substrate is smaller than or equal to the component thickness of the electronic component including the component terminal pads. This would allow to at least reduce the distance difference Δd.

The spacers, or spacer elements, may be manufactured in different ways. For example, a metallization layer may be arranged on the first main side of the first foil substrate or on the first main side of the second foil substrate. The metallization layer may be accordingly structured to generate the spacers at a desired location. In this case, the spacers would be generated in a subtractive manner, i.e. by removing material from the metallization layer. Alternatively, an additive generation would be possible. For example, the spacers could be generated by additive material application at a desired location. In the microscopic sectional view, one may distinguish whether the spacers were generated using an additive or a subtractive manufacturing method. Regardless of whether the spacers were generated using a subtractive or additive method, the spacers may have electrically conductive properties in order to connect in an electrically conductive manner the contact elements to a package terminal pad arranged on a package outside, for example.

According to a conceivable embodiment, the spacer elements may consist of a structured metallization layer arranged between the first and second foil substrates, wherein the metallization layer comprises a layer thickness to be measured between the first and second foil substrates and defining the distance between the first main side of the first foil substrate and the first main side of the second foil substrate.

According to a further conceivable embodiment, the spacer elements may comprise one or several layers arranged on top of each other and created by additive material addition, wherein these several layers comprise a total layer thickness to be measured between the first and second foil substrates and defining the distance between the first main side of the first foil substrate and the first main side of the second foil substrate.

According to a further conceivable embodiment, the spacer elements may be galvanically conductive and a respective one of the at least two spacer elements may connect a respective one of the second contact portions of a contact element to a respective one of the package terminal pads in a galvanically conductive manner.

As initially mentioned, it is advantageous if the outsides of the package comprise a flat surface. Thus, they may be handled using established assembly techniques (e.g. pick and place). In some embodiments, the spacers may therefore be dimensioned such that the outsides have a flat surface. That is, in these embodiments, the spacers are not only used to compensate, or reduce, the distance difference Δd between the two opposite first main sides of the respective foil substrate, but to make the outer surfaces of the package to be flat, i.e. the respective second main sides of the respective foil substrate. According to such an embodiment, the means for reducing and/or compensating the distance difference Δd may therefore be dimensioned such that, despite the component arranged between the first and second foil substrates, the second main side of the first foil substrate and/or the second main side of the second foil substrate have a flat surface, for example.

According to a further embodiment, the means for reducing and/or compensating the distance difference Δd may be dimensioned such that the first and/or the second foil substrate do not comprise a deformation caused by the component thickness of the component. That is, not only the surfaces of the respective foil substrate may be flat, but the entire respective foil substrate may be implemented in a deformation-free manner by means of the spacers, despite the enclosed component. This prevents the bending stresses that would otherwise occur, and therefore reduces the mechanical stress of the respective foil substrate.

Optionally, a metallization may be arranged on the second main side of the first foil substrate and/or on the second main side of the second foil substrate respectively opposite to the electronic component. This optional metallization may be used to electrically shield the component and/or to dissipate heat of a heat radiation originating from the component.

The inventive foil-based package is characterized in that it is extremely thin. For example, the foil-based package may comprise an overall thickness to be measured between the second main side of the first foil substrate and the second main side of the second foil substrate that is smaller than or equal to 250 µm, or smaller than or equal to 150 µm, or smaller than or equal to 80 µm.

In addition, the invention concerns a method for manufacturing a foil-based package comprising the above-described cavity, and a method for manufacturing a foil-based package comprising one or several of the above-described spacer elements.

BRIEF DESCRIPTION OF THE DRAWINGS

Embodiments of the present invention will be detailed subsequently referring to the appended drawings, in which:

FIG. 1A shows a schematic sectional side view of a foil-based package without the inventive means for reducing and/or compensating a distance difference, FIG. 1B shows a schematic sectional side view of a foil-based package having the inventive means for reducing and/or compensating a distance difference according to an embodiment.

In the following, embodiments are described in more detail with reference to the drawings, wherein elements having the same or a similar function are provided with the same reference numerals.

Figure 2A:
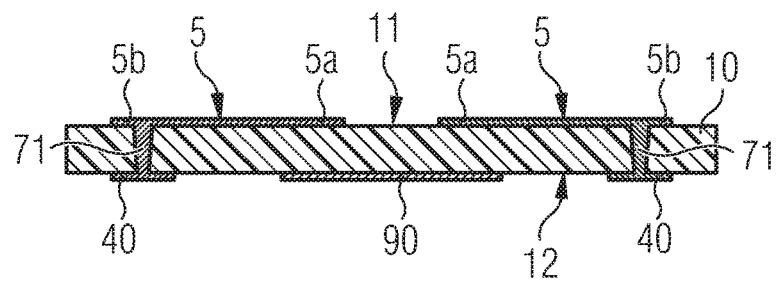
FIG. 2A shows a schematic sectional side view of a first foil substrate along the sectional line draw in FIG. 2B.

Method steps that are illustrated in a block diagram and are described with reference to the same may also be performed in any other order than the one that is illustrated or described. In addition, method steps relating to a certain feature of a device are interchangeable with said feature of the device, and vice versa.

Embodiments of the inventive package may be implemented as packages that may mounted by means of a surface mounting technique. A package in which the component is flipped once with respect to the package terminal pads is herein referred to as a first package type. Further embodiments of inventive packages may be implemented as packages in which the component is flipped twice with respect to the package terminal pads and that may be mounted by means of a SMD-compliant surface mounting technique. Such a package is referred to herein as a second package type. If packages are referred to in general, this may apply to packages of the first package type as well as packages of the second package type. In principle, an inventive foil-based package of the first package type may comprise all described embodiments of means for reducing and/or compensating a distance difference between the first foil substrate and the second foil substrate caused by the component thickness (e.g. a cavity and/or spacer elements). In principle, an inventive foil-based package of the second type may also comprise all described embodiments of means for reducing and/or compensating a distance difference between the first foil substrate and the second foil substrate caused by the component thickness (e.g. a cavity and/or spacer elements).

The inventive foil-based package is also referred to herein as a foil package or a flex-foil package. In addition, the terms package and housing are used synonymously herein. The term ultra-thin with respect to the foil-based package refers to thicknesses of below 250 µm, advantageously to thicknesses of below 200 µm, and further advantageously to thicknesses of below 150 µm. The thickness corresponds to a foil-based package layer thickness structure perpendicular to the main extension direction of the foil substrate, or perpendicular to the foil plane. For the purposes of the present description, substrates having layer thicknesses of below 130 µm are also referred to as foil substrates.

Chips, or semiconductor chips, are mentioned as a non-limiting example of an electronic component. For example, the description text refers to chips that are embedded into a flex-foil package. The term "chip" includes embodiments with a silicon material, any other semiconductor substrates, thin glass or a foil material. In particular, it should not be neglected that, instead of a "chip", there may also be a foil component. For example, a foil component having a foil thickness of 35 µm is within the definition range for the term "thin chips". Since the manufacturing requirements for structures on the foil chip may differ from the manufacturing requirements for the production of packages, it may make sense to embed a foil chip into a flex package.

Only non-limiting examples in which the respective means for reducing and/or compensating a distance difference between the first foil substrate and the second foil substrate caused by the component thickness (e.g. a cavity and/or spacer elements) is arranged on one of the two foil substrates are described in the following. However, it is also conceivable that the respective exemplarily described means for reducing and/or compensating a distance difference between the first foil substrate and the second foil substrate caused by the component thickness (e.g. a cavity and/or spacer elements) may be provided on the respectively other one of the two foil substrates or also on both foil substrates at the same time.

FIG. 1A shows an example of a foil-based package without the inventive means for reducing and/or compensating a distance difference $\Delta d=d2-d1$ between the first foil substrate 10 and the second foil substrate 20 caused by the component thickness D30.

In contrast, FIG. 1B shows an example of a foil-based package 100 having the inventive means 50, 60 for reducing and/or compensating a distance difference $\Delta d=d2-d1$ between the first foil substrate 10 and the second foil substrate 20 caused by the component thickness D30.

However, for the purpose of description, reference is first made to FIG. 1A. FIG. 1A shows a foil-based package having a first foil substrate 10 and a second foil substrate 20. The first foil substrate 10 comprises a first main side 11 and a second main side 12 arranged opposite thereto. A multitude of electrical contact elements 5 are arranged on the first main side 11. These are described in more detail below with reference to the other figures. Each contact element 5 comprises a first contact portion 5a and a second contact portion 5b laterally spaced apart therefrom, wherein the first and second contact portions 5a, 5b of a contact element 5 are galvanically connected to each other by means of a connecting portion 5c.

The second foil substrate 20 also comprises a first main side 21 and a second main side 22 arranged opposite thereto. An electronic component 30 is arranged on the first main side 21. For example, the component 30 may be a semiconductor chip. The component 30 comprises a first component side 31 and a second component side 32 arranged opposite thereto. A multitude of component terminal pads 33 are arranged on the first component side 31 for electrically contacting the component 30. The electronic component 30 comprises a component thickness D30 that is to be measured between the first and the second component side 31, 32.

The first foil substrate 10 and the second foil substrate 20 are arranged on top of each other so that the first main side 11 of the first foil substrate 10 and the first main side 21 of the second foil substrate 20 are opposite to each other.

In this case, the electronic component 30 is arranged between the first foil substrate 10 and the second foil substrate 20, wherein at least some of the multitude of the component terminal pads 33 may be connected to a respective one of the first contact portions 5a of the contact elements 5 arranged on the first main side 11 of the first foil substrate 10.

The respective second contact portion 5b of the contact elements 5 connected to the component terminal pads 33 is connected to a respective one of the multitude of package-external package terminal pads 40 for electrically contacting the foil-based package 100. For example, this connection may be realized by means of a via 71 or a dedicated electrical conductor 77.

As can be seen in FIG. 1A, the foil-based package comprises a first distance d1 between the first and the second foil substrates 10, 20 in areas that are adjacent to the mounting location of the component 30, and the foil-based package comprises a second distance d2 in areas of the mounting location of the component 30. Due to the thickness D30 of the component 30, the second foil substrate 20 arches over the component 30, so to speak. In this case, the second distance d2 is larger than the first distance d1. Therefore, the foil-based package comprises different distances d1, d2 between the first and second foil substrates 10, 20 in different areas. These different distances d1, d2 lead to a distance difference $\Delta d$ that may be calculated according to $\Delta d=d2-d1$.

In FIG. 1B, inventive means 50, 60 for reducing and/or compensating the distance difference $\Delta d$ between the first foil substrate 10 and the second foil substrate 20 caused by the component thickness D30 are provided. In general, the previous description with reference to FIG. 1A also applies to the example shown in FIG. 1B. Some elements such as the contact elements 5 or the package terminal pads 40 are not explicitly illustrated here for the sake of clarity.

However, said inventive means 50, 60 for reducing and/or compensating the distance difference $\Delta d$ can be clearly seen. For example, said means 50, 60 may comprise a cavity 50, wherein one cavity 50 each may be provided in the first main side 11 of the first foil substrate 10 and/or in the first main side 21 of the second foil substrate 20.

Alternatively or additionally, the means 50, 60 for reducing and/or compensating the distance difference $\Delta d$ may comprise one or several spacer elements 60, so-called spacers. Embodiments having such spacer elements 60 are subsequently described in more detail with reference to FIGS. 6A to 7.

For example, the means 50, 60 for reducing and/or compensating the distance difference $\Delta d$ caused by the component thickness D30 may be arranged, as is illustrated, between the first foil substrate 10 and the second foil substrate 20. In particular, the means 50, 60 for reducing and/or compensating the distance difference $\Delta d$ may be arranged between the first main side 11 of the first foil substrate 10 and the first main side 21 of the second foil substrate 20.

The means 50, 60 for reducing and/or compensating the distance difference $\Delta d$ caused by the component thickness D30 may, as their name indicates, reduce or fully compensate the distance difference $\Delta d$ between the first and second foil substrate 10, 20 previously described with reference to FIG. 1A. In the example illustrated in FIG. 1B, the means 50, 60 fully compensate the distance difference $\Delta d$ caused by the component thickness D30, i.e. $\Delta d=d2-d1=0$.

In embodiments in which the means for reducing and/or compensating the distance difference Δd comprise a cavity 50, a further distinction can be made between a first package type and a second package type:

First Package Type Having a Cavity

FIGS. 2A to 2D show an example of a foil-based package 100 according to the first package type, wherein the foil-based package 100 may be mounted with a surface mounting technique, for example. FIGS. 2A to 2D also illustrate a concrete example for manufacturing a foil-based package 100 according to the first package type.

Figure 2B:
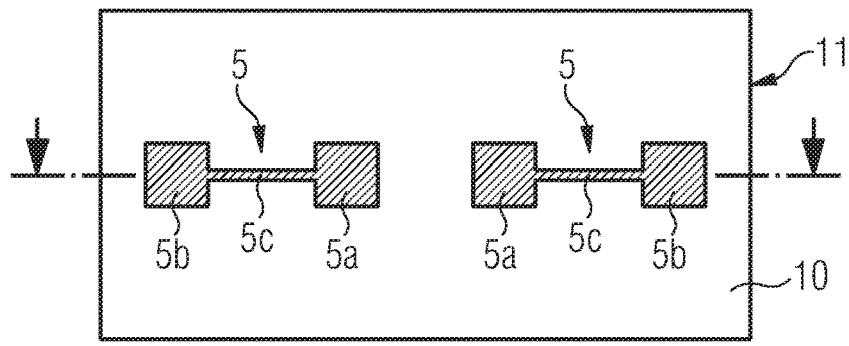
FIG. 2B shows a top view of the first main side of the first foil substrate illustrated in FIG. 2A.

FIG. 2A shows a side view of the first foil substrate 10 and FIG. 2B shows a top view of the first main side 11 of the foil substrate 10. The multitude of contact elements 5 are arranged on the first main side 11. The contact elements 5 each comprise a lateral inner first contact portion 5a. A second contact portion 5b is arranged laterally spaced apart therefrom and closer to an outer contour of the first foil substrate 10. The two contact portions 5a, 5b are galvanically connected to each other by means of the connecting element 5c. For example, the contact elements 5 may be created by means of deposition and a corresponding structuring.

The respective first contact portions 5a are arranged at locations that are opposite to the component terminal pads 33 when later assembling the package 100. A respective one of the first contact portions 5a may be arranged opposite to exactly one component terminal pad 33. The second contact portions 5b laterally routed towards the outside may be galvanically connected to the external package terminal pads 40. To this end, a via 71 extending through the first foil substrate 10 may be provided, for example.

Thus, components 30 having small pad pitches may be used, wherein the component terminal pads 33 may be contacted to the first contact portions 5a and may be routed towards the outside to package terminal pads 40 by means of the respective second contact portions 5b. For example, the arrangement of the package terminal pads 40 may satisfy specific criteria of conventional connection standards, wherein the arrangement of the package terminal pads 40 may deviate from the arrangement of the component terminal pads 33. This type of wiring is also known as fan-out wiring.

Figure 2C:
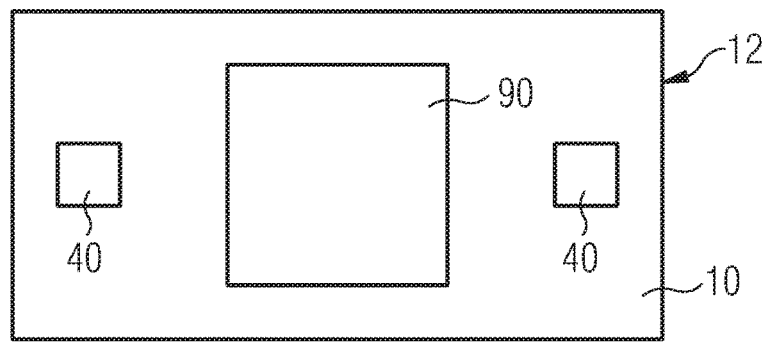
FIG. 2C shows a top view of the second main side of the first foil substrate illustrated in FIG. 2A.

FIG. 2C shows a top view of the second main side 12 of the first foil substrate 10. Here, the external package terminal pads 40 can be seen in an exemplary configuration. In the first package type, the electrical wiring and functionality may be combined on the first foil substrate 10. It may comprise a fan-out wiring on the rear side (first main side 11). In addition, vias 71 may lead from the second contact portions 5b to the package terminal pads 40 on the front side (second main side 12) of the first foil substrate 10.

Figure 2D:
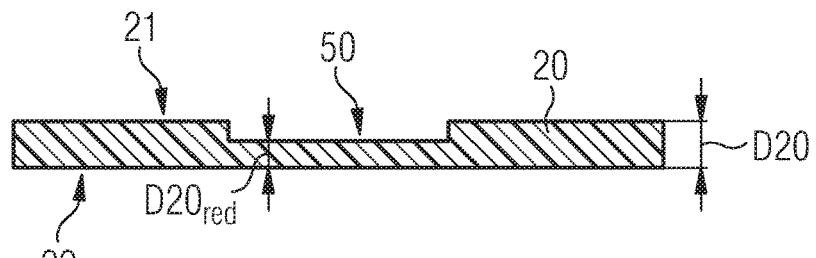
FIG. 2D shows a schematic sectional side view of a second foil substrate.

FIG. 2D shows a side view of the second foil substrate 20. The second foil substrate 20 comprises a foil thickness D20 to be measured between its first and second main sides 21, 22. In addition, the second foil substrate 20 comprises a cavity 50. The cavity 50 extends in the second foil substrate 20 from its first main side 21 to its second main side 22 so that the second foil substrate 20 comprises a reduced foil thickness $D20_{red}$ at this location. When later assembling the foil-based package 100, the electronic component 30 may be arranged within this cavity 50.

The cavity 50 may be created by means of subtractive structuring, such as by means of dry etching in combination with a shadow mask or through an ablative laser process.

Optionally, the first foil substrate 10 may be provided with an optional metallization 90 in the area of the cavity 50 on the rear side (second main side 12) in order to improve the heat dissipation or for electrical shielding. The metallization 90 is advantageously located at a location that is opposite to the electronic component 30 when later assembling the foil-based package 100. The metallization 90 may be used to electrically shield the component 30 and/or to dissipate heat of a heat radiation originating from the component 30. Alternatively or additionally, a corresponding metallization 90 may be optionally provided on the second main side 22 of the second foil substrate 20.

Figure 3:
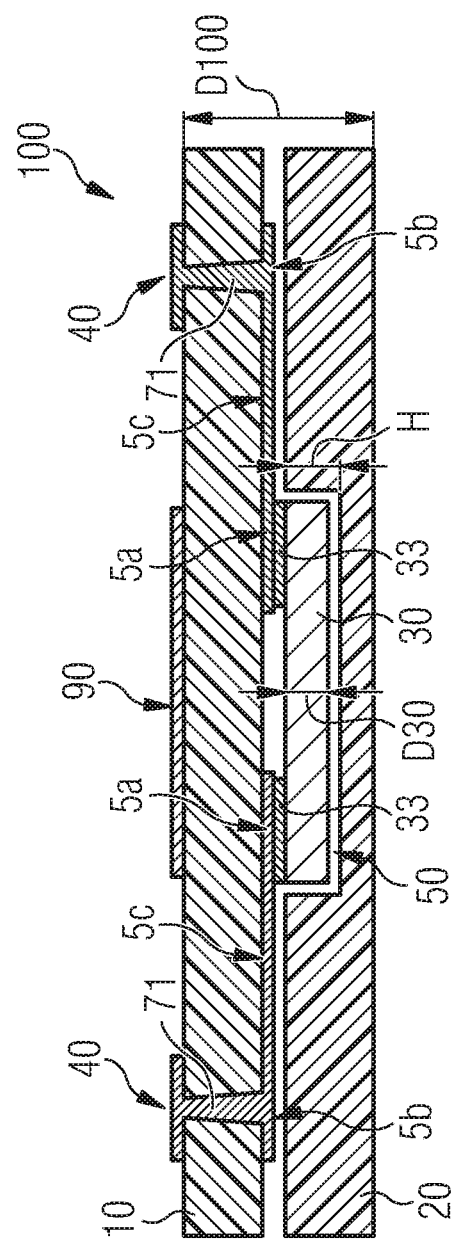
FIG. 3 shows a schematic sectional side view of an assembled foil-based package according to an embodiment of the first package type.

FIG. 3 shows a fully assembled foil-based package 100 according to the first package type, wherein the electronic component 30 is arranged sandwich-like between the two foil substrates 10, 20. The component 30 to be packaged should be available in a bumped manner (e.g. by means of: Cu pillar, Cu pillar+solder cap, stud bumps, solder bumps, Ni/Au under bump metallization) and a thinned manner (chip thickness D30<100 μm).

In this case, the component 30 may be mounted onto the first foil substrate 10, or onto the contact elements 5 located on the first foil substrate 10, using a component flip-chip mounting technique. Subsequently, the two foil substrates 10, 20 may be arranged on top of each other using a face-to-face mounting technique (foil on foil), wherein the first main side 11 of the first foil substrate 10 and the first main side 21 of the second foil substrate 20 are opposite to each other.

In the component flip-chip assembly, for manufacturing the ultra-thin chip-foil package 100, the component 30 may be adjusted, placed and contacted on the first foil substrate 10 using an appropriate bonding tool in a flip-chip manner, i.e. with the component terminal pads 33 facing downwards, so that the component terminal pads 33 on the component 30 are electrically connected to the first contact portions 5a on the foil substrate 10. This results in a so-called semi-finished foil product. All connection methods known from the flip-chip technique may be used for this process step (e.g. gluing, soldering, crimping). Depending on the assembly technique, a corresponding anisotropic conductive glue or an anisotropically conductive film or a non-conductive glue should additionally be dosed or laminated onto the first foil substrate 10 in the area of the component assembly area (e.g. the chip surface), where appropriate. This should be done before placing the component 30. Optionally, the component 30 may also be mechanically stabilized on the first foil substrate 10 by subsequently dispensing an underfill material.

In the subsequent face-to-face assembly (foil on foil), the semi-finished foil product (comprising the first foil substrate 10 and the component 30) may be placed on the front side (first main side 21) of the second foil substrate 20 with an appropriate bonding tool, with the component 30 facing downwards. In this case, the two foil substrates 10, 20 may be adjusted with respect to each other such that the component 30 comes to rest in the cavity 50 on the second foil substrate 20.

In the first package type, a non-conductive glue or an adhesive film may be applied to the front side (first main side 21) of the second foil substrate 20 in order to mechanically connect the two foil substrates 10, 20. In order to adjust the two foil substrates 10, 20 with respect to each other, corresponding optical adjustment markers may be provided in both of the foil substrates 10, 20. Optionally, a non-conductive adhesive or a so-called no-flow underfill material may be introduced into the cavity 50 on the front side (first main side 21) of the second foil substrate 20 before the mounting step in order to additionally couple the component 30 mechanically to the second foil substrate.

The two foil substrates 10, 20 may therefore be mounted on top of each other such that the electronic component 30 is placed within the cavity 50. Advantageously, the electronic component 30 may be fully arranged in the cavity 50.

The cavity 50 comprises a depth H to be measured between the first and second main sides 21, 22 of the second foil substrate 20. If the depth H of the cavity 50 is larger than or equal to the component thickness D30 of the electronic component 30 arranged therein including the component terminal pads 33, the component 30 may be fully accommodated in the cavity 50.

As can be seen in FIG. 3, a distance difference Δd between the two foil substrates 10, 20, which would arise without the means 50 for reducing and/or compensating the distance difference Δd, can be reduced or fully compensated in this case. That is, the two foil substrates 10, 20 have the same distance to each other across their entire length, i.e. in the areas in which the component 30 is mounted and also in areas spaced apart therefrom. Thus, due to the cavity 50, there is no distance difference Δd between the respective first main sides 11, 21 of the first and second foil substrates 10, 20, respectively.

The multitude of the package terminal pads 40 are arranged at the second main side 12 of the first foil substrate 10. A galvanic connection realized in this example in the form of a via 71 extending through the first foil substrate 10 is arranged between a respective package terminal pad 40 and a respective one of the second contact portions 5b. This shows that the first contact portions 5a of the contact elements 5 are arranged opposite to component terminal pads 33 and are connected to the same. With this arrangement, the entire foil-based package 100 of the first package type may be contacted from the outside from the second main side 12 of the first foil substrate 10 in terms of a flip-chip assembly arrangement.

The following characteristic signal path results for the first package type. Starting from a respective one of the multitude of component terminal pads 33, the signal path extends by way of a respective one of the connected first contact portions 5a of one of the contact elements 5. From there, the signal path extends by way of the respective connecting portion 5c connecting the respective first and second contact portions 5a, 5b of this contact element 5 up to the associated second contact portion 5b. From there, the signal path extends by way of the respective via 71 connected to the second contact portion 5b and, in the first package type, configured in the first foil substrate 10 up to a respective package terminal pad 40 connected to this via 71 and, in the first package type, arranged on the second main side 12 of the first foil substrate 10.

The final ultra-thin chip-foil package 100 according to the above-described first package type may be mounted via the package terminal pads 40 at the front side (second main side 12) of the first foil substrate 10 onto a (flexible) circuit board or a wiring foil (not shown) in a mechanical and electrical manner, e.g. using the surface mounting technique. Said package terminal pads 40 are then also located at the bottom side of the package 100. To this end, conventional methods, processes and production equipment of the printed circuit board industry may be used.

Second Package Type Having a Cavity

FIGS. 4A to 4D show an example of a foil-based package 100 according to the second package type, wherein a SMD-complied arrangement is shown here as a purely non-limiting example. FIGS. 4A to 4D also show a concrete example for manufacturing a foil-based package 100 according to the second package type.

Figure 4A:
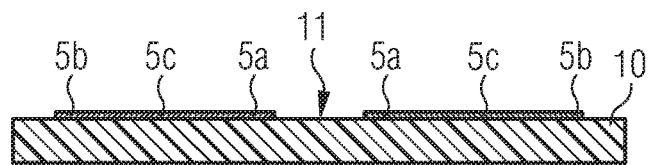
FIG. 4A shows a schematic sectional side view of a first foil substrate along the sectional line draw in FIG. 4B.
Figure 4B:
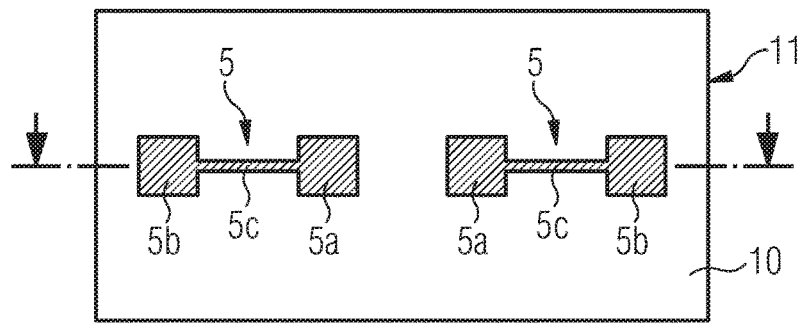
FIG. 4B shows a top view of the first main side of the first foil substrate illustrated in FIG. 4A.

As can initially be seen in FIGS. 4A and 4B, the multitude of the contact elements 5 are arranged on the first main side 11 of the first foil substrate 10, similar to the first package type (FIGS. 2A-2D).

Thus, the first foil substrate 10 may here also comprise a one-sided metallization in the form of contact elements 5 arranged in a fan-out wiring. In contrast to the first package type, where the electrical wiring and functionality are combined on the first foil substrate 10, the electrical wiring and functionality may be split onto the first and the second foil substrate 10, 20 in the second package type.

The contact elements 5 may be protected by an appropriate finish (Ni/Au, Sn). In order to create the contact elements, a metallization may be structured on the first foil substrate 10, advantageously by means of a photolithographic process. For example, this metallization may comprise copper. In the second package type, similar to the first package type, the fan-out wiring may comprise a first contact portion 5a and a second contact portion 5b that may be electrically connected to each other through an electrically conductive connecting portion 5c. The spatial arrangement and size of all of the first contact portions 5a may correspond to the spatial arrangement and at least the size of all of the component terminal pads 33. The spatial arrangement of all of the second contact portions 5b may be selected freely and may correspond to the arrangement of the package terminal pads 40 of a standard package, for example. With this, the first foil substrate 10 may expand the configuration of the component terminal pads 33 to any pattern of package terminal pads 40 (e.g. pad patterns of a standard package, e.g. SMD or QFN). When determining the arrangement of the second contact portions 5b (design), it is to be noted that the conductive paths connecting the first contact portions 5a to the second contact portions 5b do not cross each other.

Figure 4C:
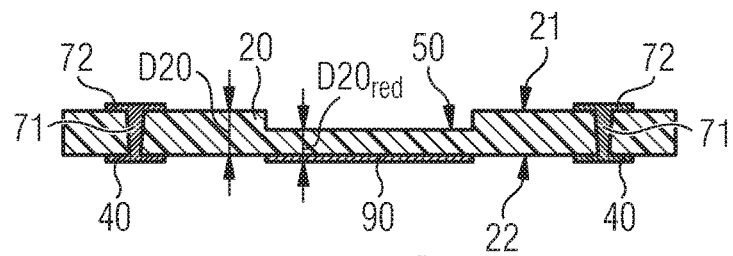
FIG. 4C shows a schematic sectional side view of a second foil substrate.
Figure 4D:
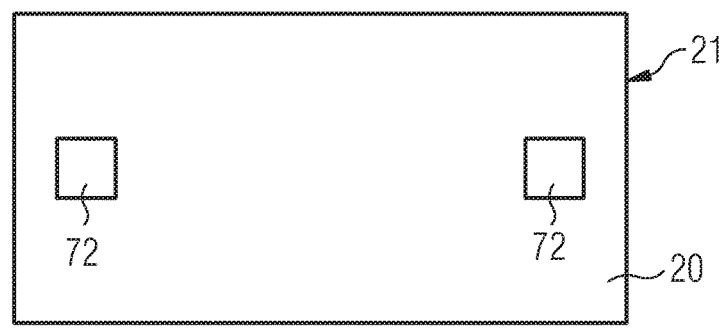
FIG. 4D shows a top view of the first main side of the second foil substrate illustrated in FIG. 4C.
Figure 4E:
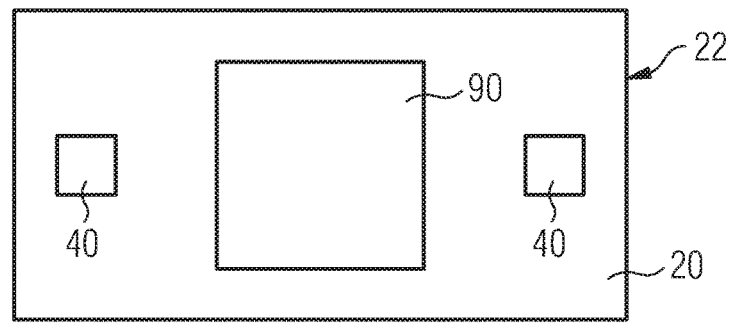
FIG. 4E shows a top view of the second main side of the second foil substrate illustrated in FIG. 4C.

As can be seen in FIGS. 4C to 4D, in contrast to the first package type (FIGS. 2A-2D), the package terminal pads 40 are not arranged on the first foil substrate 10, but on the outer side, i.e. at the second main side 22, of the second foil substrate 20.

The second foil substrate 20 may comprise a metallization on both sides in the form of contact pads 72 that may geometrically correspond to the arrangement of the second contact portions 5b on the first foil substrate 10. The contact pads 72 on the front side (first main side 21) of the second foil substrate 20 may each be electrically connected by way of a via 71 to an opposite package terminal pad 40 on the rear side (second main side 22) of the second foil substrate 20. The shape of the contact pads 72 and of the package terminal pads 40 is only determined to such an extent that there should be a geometrical overlap that at least comprises the size of the via 71. The contact pads 72 and the package terminal pads 40 on the front and rear sides 21, 22 of the second foil substrate 20 may differ with respect to material and thickness. The contact pads 72 as well as the package terminal pads 40 may be manufactured in a subtractive manner, e.g. by means of a photolithography process, and also by means of additive printing or jetting/dispensing processes. Also conceivable is a combination of the two methods, e.g. in order to increase the thickness of the contact pads 72. The surfaces of the contact pads 72 and of the package terminal pads 40 may be protected by an appropriate finish on both foil sides 21, 22.

Thus, one or several vias 71 may extend through the second foil substrate 20, wherein each via 71 may connect a respective package terminal pad 40 to a respective one of the second contact portions 5b of the contact elements 5.

Contact pads 72 that are connected to the vias 71 may be provided on the first main side 21 of the second foil substrate 20.

The vias 71, or the contact pads 72 arranged thereon, may be positioned at locations at which the respective second contact portions 5b of the contact elements 5 will be arranged when later assembling the foil-based package 100. That is, a respective via 71 is arranged opposite to a respective one of the second contact portions 5b of contact elements 5.

Advantageously, a via 71 may be manufactured by means of laser drilling through the respective foil substrate 10, 20, followed by a via filling process. The via filling process may advantageously be carried out by way of the rear side of the respective foil substrate 10, 20. For example, the via filling process may be carried out by sputtering copper and/or printing or dispensing an electrically conductive paste into the via hole. After the via filling process, the contact pads 72 on the front side (first main side 21) of the second foil substrate 20 are electrically connected to the package terminal pads 40 on the rear side (second main side 22) of the second foil substrate 20.

Here, the second foil substrate 20 also comprises a cavity 50 extending in the second foil substrate 20 from its first main side 21 to its second main side 22, so that the second foil substrate 20 comprises a reduced foil thickness $D20_{red}$ at this location. During assembly, the component 30 may here also be arranged within this cavity 50.

The cavity 50 on the front side (first main side 21) of the second foil substrate 20 may be created through a subtractive structuring of non-metallized foil areas, e.g. by dry etching and plasma, after the previously described via filling process. For the plasma structuring, the (e.g. metal) contact pads 72 may be used as a mask. Alternatively, an additional shadow mask may be employed. Alternatively, the cavity 50 may also be manufactured using an ablative laser process. It is the goal to create a topography on the front side (first main side 21) of the second foil substrate 20 that is configured such that the height difference between the contact pads 72 and the cavity 50 corresponds at least to the added thickness of the component 30 including the component terminal pads 33 and an optional contact material, e.g. bump metallizations.

An optional metallization 90 may be provided opposite to the cavity 50 on the second main side 22 of the second foil substrate 20. The metallization 90 may be used for electrically shielding the component 30 or to dissipate heat from a heat radiation originating from the component 30. Optionally or additionally, a corresponding metallization may be provided on the second main side 12 of the first foil substrate 10.

Figure 5:
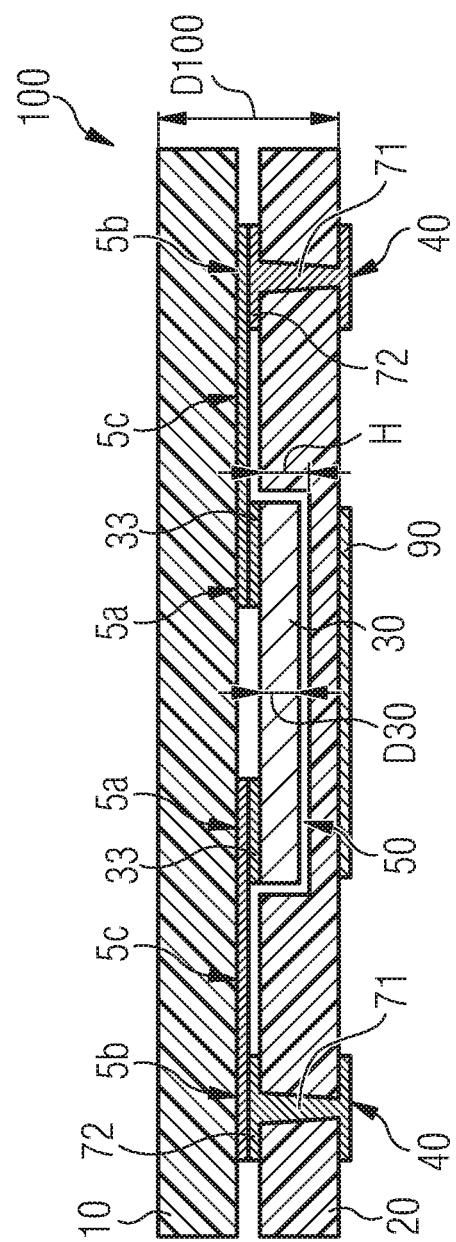
FIG. 5 shows a schematic sectional side view of an assembled foil-based package according to an embodiment of a SMD-compliant second package type.

FIG. 5 shows a final assembled foil-based package 100 according to the second package type, wherein the electronic component 30 is arranged sandwich-like between the two foil substrates 10, 20. The component 30 to be packaged should be available in a bumped manner (e.g. by means of: Cu pillar, Cu pillar+solder cap, stud bumps, solder bumps, Ni/Au under bump metallization) and thinned manner (chip thickness D30<100 μm).

In this case, the component 30 may be mounted onto the first foil substrate 10, or onto the contact elements 5 located on the first foil substrate 10, using a component flip-chip mounting technique. Subsequently, the two foil substrates 10, 20 may be arranged on top of each other using a face-to-face mounting technique (foil on foil), wherein the first main side 11 of the first foil substrate 10 and the first main side 21 of the second foil substrate 20 are opposite to each other.

During the component flip-chip assembly of the component 30, the component 30 may be adjusted, placed and contacted using an appropriate bonding tool on the foil substrate 10 in a flip-chip manner, i.e. with the component terminal pads 33 facing downwards, so that the component terminal pads 33 on the component 30 are electrically connected to the first contact portions 5a on the first foil substrate 10. This creates a so-called semi-finished foil product. This process step may be performed using all connection methods that are known from the flip-chip technique (e.g. gluing, soldering, crimping). Depending on the assembly technique, a corresponding anisotropic conductive glue or an anisotropically conductive film or a non-conductive glue should additionally be dosed or laminated onto the first foil substrate 10 in the area of the component mounting area (e.g. chip surface), where appropriate. This should be done before placing the component 30. Optionally, the component 30 may also be mechanically stabilized on the first foil substrate 10 by subsequently dispensing an underfill material.

In the subsequent face-to-face assembly (foil on foil), the semi-finished foil product (comprising the first foil substrate 10 and the component 30) may be placed on the front side (first main side 21) of the second foil substrate 20 using an appropriate bonding tool, with the component 30 facing downwards. In this case, the two foil substrates 10, 20 may be adjusted with respect to each other such that the component 30 comes to rest in the cavity 50 on the second foil substrate 20. If the component thickness D30 and the depth H of the cavity 50 are the same, the second contact portions 5b of the first foil substrate 10 may lie flat on the contact pads 72 of the front side (first main side 21) of the second foil substrate 20 in the second package type.

In the second package type, in order to electrically and mechanically connect the two foil substrates 10, 20 in the second package type, an electrically conductive isotropic or anisotropic glue or a solder paste may be applied or printed or an anisotropically conductive adhesive film material may be laminated onto the contact pads (72) and/or the exposed second contact portions 5b.

In order to adjust the two foil substrates 10, 20 with respect to each other, corresponding optical adjustment markers may be provided in both foil substrates 10, 20. Optionally, a non-conductive glue or a so-called no-flow underfill material may be introduced into the cavity 50 on the front side (first main side 21) of the second foil substrate 20 before the mounting step in order to additionally couple the component 30 mechanically to the second foil substrate 20.

Thus, the two foil substrates 10, 20 may be mounted on top of each other such that the electronic component 30 is placed within the cavity 50. Advantageously, the electronic component 30 may be fully arranged in the cavity 50.

Here, the cavity 50 also comprises a depth H to be measured between the first and second main sides 21, 22 of the second foil substrate 20. If the depth H of the cavity 50 is larger than or equal to the component thickness D30 of the electronic component 30 arranged therein including the component terminal pads 33, the component 30 may be fully accommodated in the cavity 50.

As can be seen in FIG. 5, a distance difference Δd between the two foil substrates 10, 20, which would otherwise arise without the means 50 for reducing and/or compensating the distance difference Δd, can be fully compensated in this case. That is, the two foil substrates 10, 20 comprise the same distance to each other across their entire length, i.e. in the areas in which the component 30 is mounted and also in areas spaced apart therefrom. Thus, due to the cavity 50, there is no distance difference Δd between the respective first main side 11, 21 of the first and second foil substrates 10, 20, respectively.

Furthermore, the multitude of the package terminal pads 40 are arranged on the second main side 22 of the second foil substrate 20. A galvanic connection realized in the form of a via 71 extending through the second foil substrate 20 in this example is provided between a respective package terminal pad 40 and a respective one of the second contact portions 5b. This also shows that the first contact portions 5a of the contact elements 5 are arranged opposite to the component terminal pads 33 and are connected to the same. With this arrangement, the electronic component 30 may be contacted from the outside from the second main side 22 of the second foil substrate 20 in terms of a standard-compliant assembly arrangement.

This results in the following characteristic signal path for the second package type. Starting from a respective one of the multitude of component terminal pads 33, the signal path extends by way of a respective one of the connected first contact portions 5a of one of the contact elements 5. From there, the signal path extends by way of the respective connecting portion 5c connecting the respective first and second contact portions 5a, 5b of this contact element 5 up to the associated second contact portion 5b. If there is an optional contact pad 72, the signal path extends by way of this contact pad. From there, the signal path extends by way of the respective via 71 connected to the second contact portion 5b and, in the second package type, configured in the second foil substrate 20 up to a respective one of the package terminal pads 40 connected to this via 71 and, in the second package type, arranged on the second main side 22 of the second foil substrate 20.

The final ultra-thin chip-foil package 100 according to the above-described second package type may be mounted via the package terminal pads 40 at the front side (second main side 12) of the first foil substrate 10 onto a (flexible) printed circuit board or a wiring foil (not shown herein) in a flipped mechanical and electrical manner. Said package terminal pads 40 are also located at the bottom side of the package 100. To this end, conventional methods, processes and production equipment of the printed circuit board industry may be employed.

In summary, FIGS. 2A to 5 show different embodiments of an inventive foil-based package 100 having a first foil substrate 10 and a second foil substrate 20 (e.g. having a material of Pi, PET, PEN with a thickness D10<100 μm, or D20<100 μm) that may both enclose a thin electronic component 30 in a sandwich-like manner, and wherein a recess in the form of a cavity 50 may be provided in the second foil substrate 20 in order to reduce or compensate a distance difference Δd between the first and the second foil substrates 10, 20 caused by the component thickness D30.

To this end, the cavity 50 may correspond with respect to size and depth at least to the dimensions of the electronic component 30 including the component terminal pads 33 as well as a possible contacting material (e.g. bumps, pillars, etc.).

Among other things, the two above-described inventive embodiments, i.e. the first package type and the second package type, differ in the type and the arrangement of the contact elements 5 and vias 71, which may exemplarily be configured as metallized conductive paths, that may each be located on the first and/or the second foil substrate 10, 20. In the second package type, the first foil substrate 10 may comprise contact elements 5 in the form of a one-sided structured metallization. The second foil substrate 20 may comprise a two-sided structured metallization, e.g., in the form of the contact pads 72 on the first main side 21 and an optional metallization 90 and/or the package terminal pads 40 on the second main side 22. In the first package type, the first foil substrate 10 may comprise a two-sided structured metallization, e.g. in the form of the contact elements 5 on the first main side 11 and an optional metallization 90 and/or the package terminal pads 40 on the second main side 12. The second foil substrate 20 may comprise no metallization 90 on the second main side 21 or at least an optional metallization.

In the first and second package types, the component 30 may be mechanically and electrically connected to the first foil substrate 10 in a component flip-chip mounting step (chip on foil). In a second face-to-face mounting step (foil on foil), the first and second foil substrate 10, 20 may be mechanically connected to each other, and in the second package type also electrically connected to each other. Through this, an electrical low-resistance signal connection may be realized between the component terminal pads 33 and the package terminal pads 40 on the rear side (second main side 22) of the second foil substrate 20 of the package (second package type), or the package terminal pads 40 on the front side (second main side 12) of the first foil substrate 10 of the package (first package type).

A common feature of both types of the inventive chip-foil package 100 is that the component 30 may be mounted onto the first foil substrate 10 (chip on foil) using a component flip-chip mounting technique, in combination with a face-to-face mounting technique (foil on foil), leading to a thin foil-based package 100 that advantageously fully surrounds the component 30. This results in a stand-alone package 100 in which, depending on the embodiment, the component may be mounted onto a printed circuit board either flipped twice with respect to the package terminal pads (second package type) or flipped once with respect to the package terminal pads (first package type). According to the invention, thin foils 10, 20 that may be processed in continuous reel-to-reel processes are used as materials for the package 100, in contrast to the description of the state-of-the-art. In contrast to patent DE 10 2010 042 567.2, the housing is not created by packing the semiconductor chip, but by mounting two specially prepared semi-finished foil products on top of each other. In contrast to patent DE 19542883 C2, the cavity is not achieved by forming flexible sheets, but by a structured subtractive material removal. In contrast to the packages consisting of flexible sheets described in the state-of-the-art, the inventive foil-based package 100 may be absolutely flat.

The inventive package comes close to the ideal shape of the COB in terms of height, but is compatible with the well-established fully automated package-based standard assembly processes (pick and place) of the industry.

The following advantages result from the foil-based packages 100 according to the first package type described herein and the second package type described herein:

The described inventive ultra-thin chip-foil packages 100 with a fan-out wiring 5 for semiconductor chips 30 with a large number of I/O contacts (component terminal pads 33) and small pitches may be assembled like standardized packages on (flexible) printed circuit board substrates or wiring foils by means of a pick and place technique. The overall structural height.

D100 of the package 100 results from the thickness D10 of the first foil substrate 10 and the thickness D20 of the second foil substrate 20 and the thickness of a connecting layer between the first and second foil substrates 10, 20. In an embodiment, the thickness of the two foil substrates 10, 20 was 50 µm each, the depth H of the cavity 50 and the component thickness D30 were 30 µm each, and the depth of a connecting layer between the first and second foil substrates 10, 20 was 5 µm each. This resulted in an overall thickness D100 of the package 100 of only 105 µm.

Despite the use of bendable housing components, the inventive foil-based packages 100 may be absolutely flat and may therefore be handled like rigid packages.

Due to the low thickness and the flexible materials used (foils 10, 20, thin semiconductor chips 30), the flat packages 100 may be reversibly deformed under bending stress. They are therefore suitable for use on electrical circuit carriers that are being permanently or repeatedly mechanically deformed.

Adjusting the foil thicknesses of the first and second foil substrates 10, 20 and the depth H of the cavity 50 in the second foil substrate 20 makes it possible to place the semiconductor chip 30 in the final package 100 in the neutral zone of the package 100. The neutral zone is characterized in that the foil substrates 10, 20 have the same thickness above and below the semiconductor chip 30, respectively. In an embodiment, the overall thickness of the first foil substrate 10 was 25 µm, the thickness of the second foil substrate 20 was 50 µm, the depth H of the cavity 50 and the component thickness D30 were 25 µm each, and the thickness of the connecting layer between the first and second foil substrates 10, 20 was 5 µm. With an overall thickness of the package 100 of 80 µm, this resulted in a foil layer above and below the semiconductor chip 30 having a thickness of 25 µm each. This significantly reduces the mechanical stress acting on the semiconductor chip 30 when bending the package 100.

Compared to conventional flip-chip techniques in which the arrangement of the component terminal pads 33 is mirrored as a consequence of the assembly process and a re-wiring (re-routing) step is therefore mandatory, this may be omitted with the described inventive embodiment according to the first package type. During assembly, the chip 30 is flipped twice according to the invention: once in the component flip-chip assembly of the semiconductor chip 30 onto the first foil substrate 10 and again in the package flip-chip assembly of the package 100 onto a printed circuit board. Thus, the arrangement of the component terminal pads 33 on the printed circuit board again corresponds to that of the semiconductor chip 30. Thus, the pin compatibility to a package contacted by a wire bond technique is therefore ensured in the flip-chip assembly of the inventive package 100 of the first package type.

Due to the cavity 50 in the second foil substrate 20 and the therefore reduced wall thickness of the package 100 in the area of the semiconductor chip 30, heat dissipation of the chip 30 through the package 100 is significantly improved. This may be further improved an optional metal surface 90 on the rear side (second main side 22) of the second foil substrate 20 and/or on the front side (second main side 12) of the first foil substrate 10 in the area of the semiconductor chip area. The packages 100 may be produced cost-effectively in very large quantities using reel-to-reel production techniques.

In the first package type and in the second package type, extremely thin chip packages 100 having a package thickness D100 of less than 150 µm may be realized by active chips 30 serving small pitches and high I/O numbers on the chip side, comprising a mechanical flexibility according to the embodiment, dissipate heat well and may be installed using standard methods used in the industry.

First and/or Second Package Type Having Spacer Elements

FIGS. 6A to 6D show an example of a foil-based package 100 in which the means for reducing and/or compensating the distance difference Δd comprise at least two spacer elements 60 arranged between the first and second foil substrates 10, 20. FIGS. 6A to 6D also show a concrete example for manufacturing such a foil-based package 100 having spacer elements 60. The spacer elements 60 may be provided alternatively or additionally to the above-described cavity 50 as means for reducing and/or compensating the distance difference Δd between the first foil substrate 10 and the second foil substrate 20 caused by the component thickness D30.

Figure 6A:
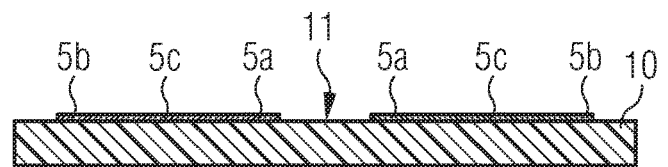
FIG. 6A shows a schematic sectional side view of a first foil substrate along the sectional line drawn in FIG. 6B.
Figure 6B:
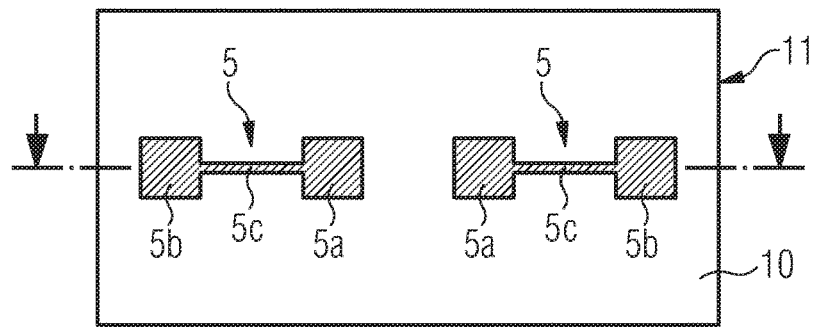
FIG. 6B shows a top view of the first main side of the first foil substrate illustrated in FIG. 6A.

As can initially be seen in FIGS. 6A and 6B, the multitude of the contact elements 5 are arranged on the first main side 11 of the first foil substrate 10, similar to the previous examples (FIGS. 2A-2D and 4A-4D).

For example, the first foil substrate 10 may comprise a one-sided metallization in the form of contact elements 5 arranged in an above-described fan-out wiring. The contact elements 5 may be protected by an appropriate finish (Ni/Au, Sn). The contact elements 5 are structured on the first foil substrate 10 advantageously by means of a photolithographic process. For example, the contact elements 5 may comprise copper. The fan-out wiring may be characterized by a first contact portion 5a and a second contact portion 5b that are electrically connected by means of a connecting portion 5c. The spatial arrangement and size of all of the first contact portions 5a may correspond to the spatial arrangement and at least the size of all of the component terminal pads 33 on the component 30. The spatial arrangement of all of the second contact portions 5b may be selected freely and may correspond to the arrangement of the package terminal pads 40 of a standard package, for example. With this, the first foil substrate 10 expands the configuration of the component terminal pads 33 to any contact pad pattern (e.g. pad patterns of a standard package, e.g. SMD or QFN). When determining the arrangement of the second contact portions 5b (design), it is to be noted that the conductive paths connecting the first and second contact portions 5a, 5b do not cross each other.

Figure 6C:
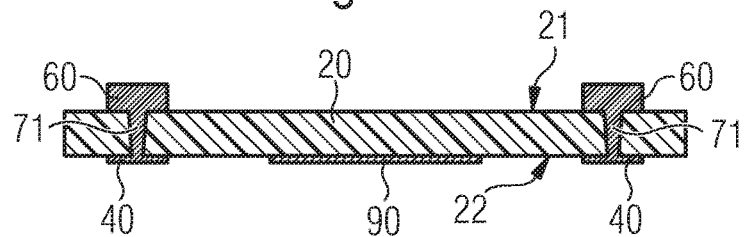
FIG. 6C shows a schematic sectional side view of a second foil substrate.
Figure 6D:
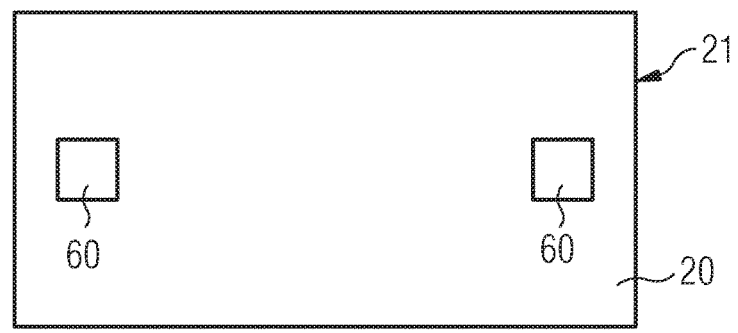
FIG. 6D shows a top view of the first main side of the second foil substrate illustrated in FIG. 6C.
Figure 6E:
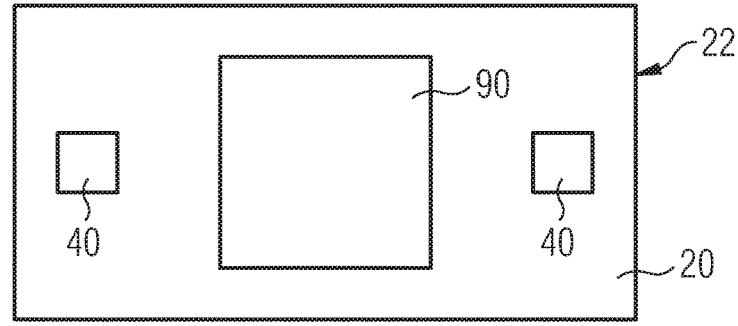
FIG. 6E shows a top view of the second main side of the second foil substrate illustrated in FIG. 6C.

As can be seen in FIGS. 6C and 6D, among other things, the difference to the above-described examples is that spacer elements 60 are arranged between the first main side 11 of the first foil substrate 10 and the first main side 21 of the second foil substrate 20. As is illustrated in FIG. 6C, the spacer elements 60 may be arranged on the first main side 21 of the second foil substrate 20. Alternatively or additionally, one or several spacer elements 60 may be arranged on the first main side 11 of the first foil substrate 10.

For example, the spacer elements 60 may be contact pads that are enlarged in the thickness direction (in a direction to be measured between the first main side 11 of the first foil substrate 10 and the first main side 21 of the second foil substrate 20). For example, they may be the contact pads 72 previously discussed with reference to FIGS. 4A-E and 5.

The spacer elements 60 may be galvanically connected to a via 71 extending through the respective foil substrates 10, 20. The spacer elements 60 may be connected to package-external package terminal pads 40 by means of the via 71. As is exemplarily shown in FIG. 6C, the package terminal pads 40 may be arranged on the second main side 22 of the second foil substrate 20.

The at least two spacer elements 60 may be laterally spaced apart from each other, wherein the element 30 may be arranged during the assembly of the package 100 in the gap created by this, i.e. between the two spacer 60.

In addition, the spacer elements 60 are advantageously arranged at locations at which the respective second contact portions 5b of the contact elements 5 will be arranged when later assembling the package 100. That is, a respective one of the spacer elements 60 may be arranged opposite to a respective one of the second contact portions 5b of the contact elements 5.

The spacer elements 60 may be configured to be galvanically conductive. To this end, the second foil substrate 20 may comprise, e.g. on its first main side 21, a metallization configured in the form of the spacer elements 60 and which may geometrically correspond to the arrangement of the second contact portions 5b on the first foil substrate 10. The spacer elements 60 on the front side (first main side 21) of the second foil substrate 20 may have such a thickness, or be reinforced, in the z direction so that their height corresponds to the component thickness D30 of the semiconductor chip 30 including the component terminal pads 33 and an optional contact material (e.g. bumps). In addition, the spacer elements 60 may each be electrically connected to an opposite package terminal pad 40 on the rear side (second main side 22) of the second foil substrate 20 by way of a via 71.

The shape of the spacer elements 60 and the package terminal pads 40 is only determined to such an extent that there should be a geometrical overlap having at least the size of the via 71. According to the invention, while, for generating the galvanically conductive spacer elements 60 on the front side (first main side 21) of the second foil substrate 20, the thickness of the metallization should at least have the thickness of the component thickness D30 of the semiconductor chip 30 including the component terminal pads 33 and an optional contact material (e.g. bumps), a metallization on the rear side (second main side 22) of the second foil substrate 20 may advantageously be configured as a thin film metallization for generating the package terminal pads 40. Manufacturing the spacer elements 60 on the front side (first main side 21) of the second foil substrate 20 may be done in a subtractive manner, or in a semi-additive manner, by means of a photolithography process, and also by means of additive printing or jetting/dispensing processes. When using a subtractive photolithography process, the thickness of the initial metallization for the spacer elements 60 may be selected such that it already corresponds initially to the added thickness of the semiconductor chip 30 and the bump. The structures, i.e. the semiconductor elements 60, are then created through a wet-chemical etching process. In the semi-additive photolithography process, a metallization may be built locally up to the target height (thickness D60 of the spacer elements 60) in the area of the contact faces of the spacer elements 60. In the additive printing or jetting/dispensing processes, a sufficient amount of material may be applied so that the spacer elements 60 reach the target height. The metallization on the rear side (second main side 22) of the second foil substrate 20 may advantageously be created in a subtractive manner, starting from a thin initial metallization. However, it may also be manufactured by means of printing or jetting processes. The respective metallization on both foil sides 21, 22 may be protected by an appropriate finish.

Manufacturing the vias 71 may be advantageously done by means of laser drilling through the second foil substrate 20, followed by a via filling process. The via filling process may be advantageously performed via the rear side (second main side 22) of the second foil substrate 20. The via filling process may be performed by means of sputtering of copper, or printing or dispensing an electrically conductive paste, into the via hole. After the via filling process, the spacer elements 60 on the front side (first main side 21) may be electrically connected to the package terminal pads 40 on the rear side (second main side 22).

Optionally, the second foil substrate 20 may comprise an optional metallization 90 in the area of the semiconductor chip face on the rear side (second main side 22) for improving the heat dissipation or for electrical shielding. That is, opposite to the mounting location of the component 30 used later, an optional metallization 90 may be provided on the second main side 22 of the second foil substrate 20. The metallization 90 may be used to electrically shield the component 30 and/or to dissipate heat of a heat radiation originating from the component 30. Optionally or additionally, a corresponding metallization may be provided on the second main side 12 of the first foil substrate 10.

Figure 7:
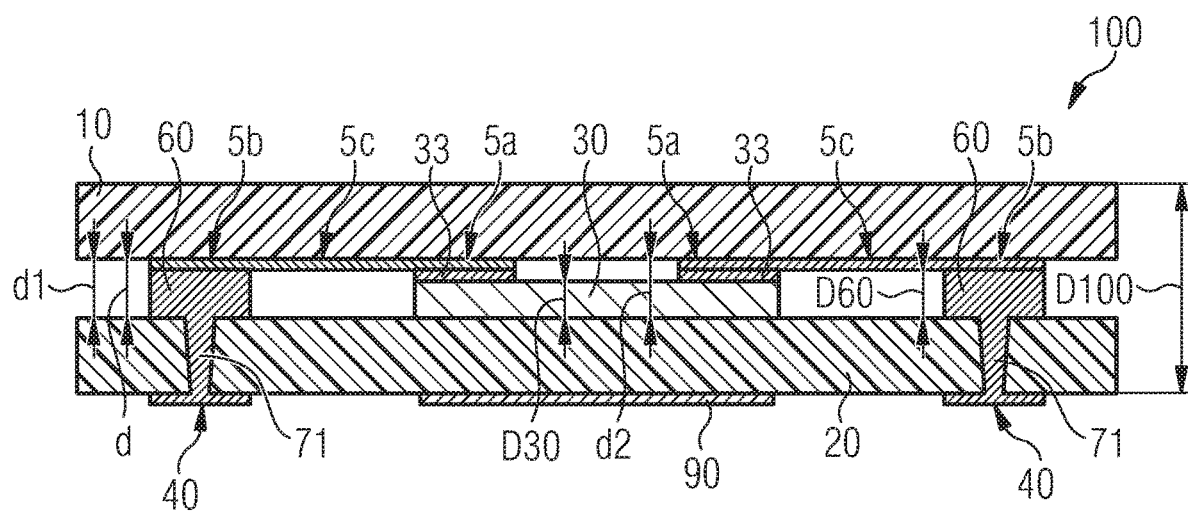
FIG. 7 shows a schematic sectional side view of an assembled foil-based package according to an embodiment having spacer elements.

FIG. 7 shows a final assembled foil-based package 100 in which the means for reducing and/or compensating the distance difference Δd comprise at least two spacer elements 60 of the above type which are arranged between the first and second foil substrates 10, 20. The electronic component 30 is sandwiched between the two foil substrates 10, 20. The component 30 to be packaged should be implemented in a bumped manner 33 (e.g. by means of: Cu Pillar, Cu pillar+ solder cap, stud bumps, solder bumps, Ni/Au under bump metallization) and thinned manner (chip thickness D30<100 μm).

In this case, the component 30 may be mounted on the first foil substrate 10, or on the contact elements 5 located on the first foil substrate 10, using a component flip-chip mounting technique. Subsequently, the two foil substrates 10, 20 may be arranged on top of each other in a face-to-face mounting technique (foil on foil), wherein the first main side 11 of the first foil substrate 10 and the first main side 21 of the second foil substrate 20 are opposite to each other.

In the component flip-chip assembly, the component 30 may be adjusted, placed and contacted on the first foil substrate 10 using an appropriate bonding tool in a flip-chip manner, i.e. with the component terminal pads 33 facing downwards, such that the component terminal pads 33 on the component 30 are electrically connected to the first contact portions 5a on the first foil substrate 10. This creates a so-called semi-finished foil product. All connection methods known from the flip-chip technique can be used for this process step (e.g. gluing, soldering, crimping). Depending on the assembly technique, a corresponding anisotropic conductive glue or an anisotropically conductive film or a non-conductive glue should additionally be dosed or laminated onto the first foil substrate 10 in the area of the component mounting area (e.g. chip face), where appropriate. This should be done before placing the component 30. Optionally, the component 30 may be mechanically stabilized by subsequently dispensing an underfill material on the first foil substrate 10.

In the subsequent face-to-face assembly (foil on foil), the semi-finished foil product (comprising the first foil substrate 10 and the component 30) may be placed on the front side (first main side 21) of the second foil substrate 20 using an appropriate bonding tool, with the component 30 facing downwards. The two foil substrates 10, 20 may be adjusted with respect to each other such that the second contact portions 5b on the first foil substrate come to rest face-to-face on the spacer elements 60, e.g. implemented as reinforced contact pads, on the first main side 21 of the second foil substrate 20. If the height of the spacer elements 60 on the second foil substrate 20 exactly matches the thickness of the semiconductor chip 30 and the bump, all spacer elements 60 are located between the first and the second foil substrate 10, 20 in a plane, and a fully flat package 100 is created.

In order to electrically and mechanically connect the two foil substrates 10, 20, an electrically conductive isotropic or anisotropic glue or a solder paste may be applied or printed or an isotropically conductive adhesive film material may be laminated onto the spacer element 60 on the front side (first main side 21) of the second foil substrate 20 and/or onto the exposed second contact portions 5b on the first foil substrate 10.

In order to adjust the two foil substrates 10, 20 with respect to each other, corresponding optical alignment markers may be provided in both foil substrates 10, 20.

A non-conductive glue or a so-called no flow underfill material may optionally be applied to the front side (first main side 21) of the second foil substrate 20 laterally between the spacer elements 60 before the mounting step in order to additionally couple the semiconductor chip 30 mechanically to the foil substrate 20 and to prevent cavities from forming in the final package 100.

As can be seen in FIG. 7, the electronic component 30 may be arranged between two spacer elements 60 laterally spaced apart from the component 30. The spacer elements 60 are configured to create a distance d between the first main side 11 of the first foil substrate 10 and the first main side 21 of the second foil substrate 20. In addition, the spacer elements 60 may fully extend through a gap between the first main side 11 of the first foil substrate 10 and the first main side 21 of the second foil substrate 20.

Advantageously, the spacer elements 60 may be dimensioned such that the distance d between the first main side 11 of the first foil substrate 10 and the first main side 21 of the second foil substrate 20 is larger than or equal to the component thickness D30 of the electronic component 30 including the component terminal pads 33.

As can further be seen in FIG. 7, a distance difference Δd between the two foil substrates 10, 20 which would otherwise arise without the spacer elements 60, can be fully compensated in this case. That is, the two foil substrates 10, 20 comprise the same distance d=d1=d2 with respect to each other across their entire length, i.e. in the areas in which the component 30 is mounted and in areas spaced apart therefrom. Thus, due to the spacer elements 60, there is no distance difference Δd between the respective first main sides 11, 21 of the first and second foil substrates 10, 20, respectively, i.e. d=d1=d2 and Δd=d2−d1=0.

In the example illustrated in FIG. 7, the spacer elements 60 are galvanically conductive, wherein a respective one of the at least two spacer elements 60 connects a respective one of the second contact portions 5b of a contact element 5 in a galvanically conductive manner to a respective one of the external package terminal pads 40 by way of the via 71.

The resulting signal path essentially corresponds to the signal path described above with reference to FIG. 5, with the exception that the spacer elements 60 are here additionally arranged in the signal path between the second contact portions 5b and the vias 71.

For example, the spacer elements 60 may be created in an additive manner by means of material application. For example, the optional contact pads 72 previously described with reference to FIG. 5 may be built vertically in their height direction by means of material application to create the spacer elements 60 illustrated in FIG. 7. That is, the spacer elements 60 may comprise at least one material layer grown by means of additive material application. For example, a material layer may be a metallization layer grown by means of epitaxy. The layer thickness D60 of the grown material layer defines the height of the spacer elements 60 and therefore also the distance d between the first main side 11 of the first foil substrate 10 and the first main side 21 of the second foil substrate 20.

Alternatively, it may also be conceivable to apply a material layer, e.g. a metallization layer, with a layer thickness D60 onto the first main side 21 of the second foil substrate 20. This material layer may be structured accordingly, consequently resulting in the spacer elements 60. Thus, the layer thickness D60 of the structured material layer defines the height of the spacer elements 60 and therefore also the distance d between the first main side 11 of the first foil substrate 10 and the first main side 21 of the second foil substrate 20.

The final thin chip-foil package 100 may be mechanically and electrically mounted onto a (flexible) printed circuit board or a wiring foil, which are not explicitly illustrated, via the package terminal pads 40, which are below the package 100, at the rear side (second main side 22) of the second foil substrate 20. To this end, the conventional methods, processes and production equipment of the printed circuit board industry may be employed.

In summary, FIGS. 6A to 7 show embodiments of an inventive foil-based package 100 in which the means for reducing and/or compensating the distance difference Δd between the two foil substrates 10, 20 may comprise one or several spacer elements 60. The package 100 may comprise a first foil substrate 10 and a second foil substrate 20 (e.g. material: Pi, PET, PEN thickness of <100 μm) that both enclose a thin semiconductor chip 30 in a sandwich-like manner. A metallization of contact pads on the first main side 21 of the second foil substrate 20 may be configured in a reinforced manner such that the spacer elements 60 may be generated therefrom, wherein the distance d between the two foil substrates 10, 20 may correspond to the thickness D30 of the component 30 including the component terminal pads 33 and an optional contact material (e.g. bumps). The first foil substrate 10 may comprise a one-sided structured metallization defining the contact elements 5 arranged in a fan-out configuration. The second foil substrate 20 may comprise a two-sided structured metallization, wherein a metallization on the first main side 21 may define the spacer elements 60 and a second metallization on the second main side 22 may define the package terminal pads 40. In a first component flip-chip mounting step (chip on foil), the component 30 may be mechanically and electrically connected to the first foil substrate 10. In a second face-to-face mounting step (foil on foil), the first and second foil substrates 10, 20 may be mechanically and electrically connected to each other. With this, an electrical low-resistance signal connection may be realized between the component terminal pads 33 and the package terminal pads 40 on the rear side (second main side 22) of the second foil substrate 20 of the package 100.

The inventive foil-based chip-foil package 100 described herein therefore uses a component flip-chip mounting technique (chip on foil) in combination with a face-to-face mounting technique (foil on foil), leading to a thin foil housing which may in turn fully enclose a semiconductor chip 30. In contrast to US 2002/121 707 A, a stand-alone package that may be mounted onto a printed circuit board like a SMD package is described. In contrast to patent DE 10 2010 042 567.2, the housing is not generated by packing the semiconductor chip, but by mounting two specially prepared semi-finished foil products on top of each other. In contrast to patent DE 19542883 C2, the chip thickness is not compensated through forming the flexible sheets, but by spacer elements 60 that may be generated by a partial additive reinforcement of metallization layers, or conductive paths, for example. In contrast to the packages consisting of flexible sheets as described in the conventional technology, the inventive package 100 may be absolutely flat.

With respect to the structural height, the inventive package 100 comes close to the ideal form of the COB, however, it is compatible with the well-established fully automated package-based standard assembly processes (pick and place) of the industry.

The ultra-thin chip-foil packages 100 with fan-out wiring for semiconductor chips 30 with a large number of component terminal pads 30 and small pitches as described according to the invention may be assembled like standardized packages on (flexible) printed circuit boards or wiring foils by means of the pick and place technique. In the embodiment described with reference to FIGS. 6A to 7, the overall structural height D100 of the package 100 results from the thickness D10 of the first foil substrate 10 and the thickness D20 of the second foil substrate 20 and the component thickness D30 of the component 30 and the optional connecting layer between the first and second foil substrates 10, 20. In an embodiment, the thickness D10, D20 of the two foil substrates 10, 20 was 50 μm each, the component thickness D30 of the component 30 including the component terminal pads 33 and the bumps was 35 μm in total and the thickness of a connecting layer was 5 μm. This resulted in an overall thickness D100 of the package 100 of merely 140 μm.

Despite the use of bendable housing components, the packages 100 may be absolutely flat and may therefore be handled like rigid packages. Due to the low thickness D100 and the flexible materials used (foils, thin semiconductor chips), flat packages 100 may be reversibly deformed upon bending stresses. They are therefore suitable for use on electrical circuit carriers that are being permanently or repeatedly mechanically deformed. The packages 100 may be produced cost effectively in very large quantities using reel-to-reel production techniques.

For all embodiments described herein, as is shown with the exception of FIG. 1A in all figures, the means 50, 60 for reducing and/or compensating the distance difference Δd may be dimensioned such that, despite the component 30 arranged between the first and second foil substrates 10, 20, the second main side 12 of the first foil substrate 10 and/or the second main side 22 of the second foil substrate 20 may each have a flat surface. In contrast to FIG. 1A, the flat surface has the advantage that the inventive packages 100 may be used in established assembly processes (e.g. pick and place) despite their very thin structure.

Alternatively or additionally, the means 50, 60 for reducing and/or compensating the distance difference Δd may dimensioned such that the first and/or the second foil substrates 10, 20 do not comprise a deformation caused by the component thickness D30 of the component 30. In contrast, FIG. 1A shows such a deformation of the first substrate 10. A deformation-free implementation of the foil substrates 10, 20 significantly reduces the mechanical stress acting on them and therefore increases the durability of the foil substrates 10, 20.

The inventive ultra-thin chip-foil package 100 may be advantageously used in applications in which the size and the structural height play an important role. In addition to high-end smartphones, applications in the area of IoT (Internet of Things) or the industry 4.0 are addressed in particular, some of which place high demands on size and structural height. For applications in which mechanically flexible, i.e. bendable, substrates are used (such as for wearables or on molded surfaces), the use of the described inventive packages 100, which are mechanically flexible, is of advantage since this may decrease the mechanical stress in the entire assembly, for example.

Figure 8:
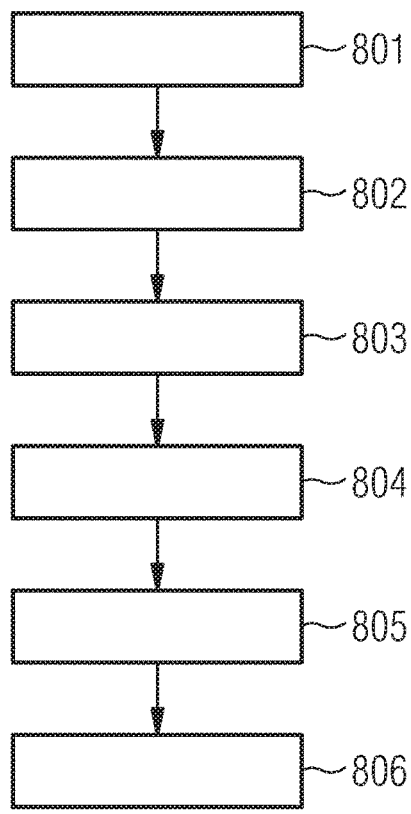
FIG. 8 shows a schematic block diagram for illustrating a method for manufacturing a foil-based package having a cavity according to an embodiment.

FIG. 8 shows a schematic block diagram of a method for manufacturing a foil-based package 100 having a cavity 50 as means for reducing and/or compensating a distance difference Δd between the first main side of the first foil substrate 10 and the first main side 21 of the second foil substrate 20 caused by the component thickness D30. The method applies to manufacturing the above-described first package type and to manufacturing the above-described second package type.

In block 801, a first foil substrate 10 with a first main side 11 and an opposite second main side 12 is provided, wherein a multitude of electrical contact elements are arranged on the first main side 11, wherein each contact element 5 comprises a first contact portion 5a and a second contact portion 5b laterally spaced apart therefrom, wherein the first and second contact portions 5a, 5b of a contact element 5 are galvanically connected to each other by means of a connecting portion 5c. In block 802, a second foil substrate 20 with a first main side 21 and an opposite second main side 22 is provided.

In block 803, a cavity 50 is introduced into the second foil substrate 20 so that the cavity 50 extends starting from the first main side 21 to the second main side 22 of the second foil substrate 20.

In block 804, an electronic component 30 with a first component side 31 and an opposite second component side 32 is provided, wherein a multitude of component terminal pads 33 for electrically contacting the component 30 are arranged on the first component side 31, and wherein the electronic component 30 comprises a component thickness D30 to be measured between the first and the second component side 31, 32.

In block 805, the component 30 is arranged on the first main side 11 of the first foil substrate 10 such that at least some of the multitude of component terminal pads 33 are connected to a respective one of the first contact portions 5a of the contact elements 5.

In block 806, the first foil substrate 10 is arranged on the second foil substrate 20 such that the component 30 is placed into the cavity 50 and such that the first main side 11 of the first foil substrate 10 and the first main side 21 of the second foil substrate 20 are arranged opposite to each other and cover the electronic component 30 arranged in the cavity 50 on both sides.

Figure 9:
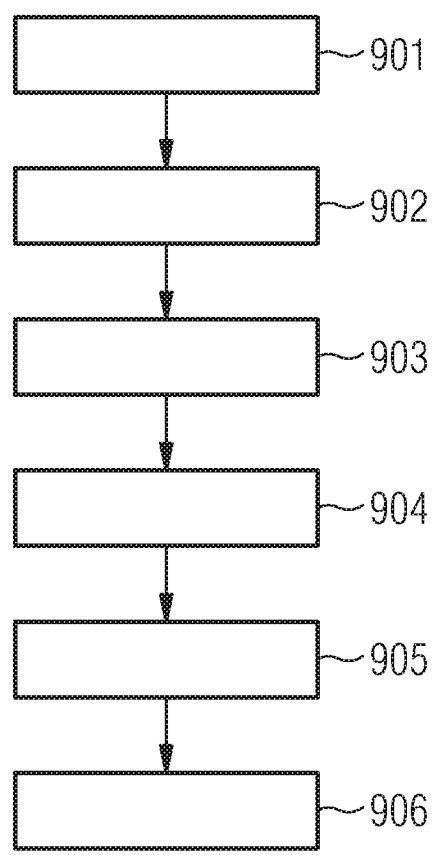
FIG. 9 shows a schematic block diagram for illustrating a method for manufacturing a foil-based package having spacer elements according to an embodiment.

FIG. 9 shows a schematic block diagram of a method for manufacturing a foil-based package 100 having at least two spacers 60 as means for reducing and/or compensating a distance difference Δd between the first main side of the first foil substrate 10 and the first main side 21 of the second foil substrate 20 caused by the component thickness D30. The method applies to manufacturing the above-described first package type and to manufacturing the above-described second package type.

In block 901, a first foil substrate 10 with a first main side 11 and an opposite second main side 12 is provided, wherein a multitude of electrical contact elements 5 are arranged on the first main side 11, wherein each contact element 5 comprises a first contact portion 5a and a second contact portion 5*b* laterally spaced apart therefrom, and wherein the first and second contact portions 5*a*, 5*b* of a contact element 5 are galvanically connected to each other by means of a connecting portion 5*c*.

In block 902, a second foil substrate 20 with a first main side 21 and an opposite second main side 22 is provided.

In block 903, at least two spacer elements 60 are arranged between the first main side 11 of the first foil substrate 10 and the first main side 21 of the second foil substrate 20, wherein a first spacer element 60 is connected to one of the second contact portions 5*b* of one of the contact elements 5, and wherein a second spacer element 60 is connected to one of the second contact portions 5*b* of another one of the contact elements 5.

In block 904, an electronic component 30 with a first component side 31 and an opposite second component side 32 is provided, wherein a multitude of component terminal pads 33 for electrically contacting the component 30 are arranged on the first component side 31, and wherein the electronic component 30 comprises a component thickness D30 to be measured between the first and the second component sides 31, 32.

In block 905, the component 30 is arranged on the first main side 11 of the first foil substrate 10 such that at least some of the multitude of the component terminal pads 33 are connected to a respective first contact portion 5*a* of the contact elements 5 arranged on the first main side 11 of the first foil substrate 10.

In block 906, the first foil substrate 10 is arranged on the second foil substrate 20 such that the first main side 11 of the first foil substrate 10 and the first main side 21 of the second foil substrate 20 are opposite to each other and cover the electronic component 30 on both sides and such that the spacer elements 60 keep the first main side 11 of the first foil substrate 10 and the first main side 21 of the second foil substrate 20 spaced apart from each other.

The following states further embodiments which may be combined with the above-mentioned embodiments and in particular with the appended patent claims without any limitations:

1. Foil-based package (100), comprising:
    a first foil substrate (10) with a first main side (11) and an opposite second main side (12),
    a second foil substrate (20) with a first main side (21) and an opposite second main side (22),
    an electronic component (30) arranged between the first foil substrate (10) and the second foil substrate (20),
    wherein the first foil substrate (10) and the second foil substrate (20) are arranged on top of each other such that the first main side (11) of the first foil substrate (10) and the first main side (21) of the second foil substrate (20) are opposite to each other, and
    means (50, 60) for reducing and/or compensating a distance difference ($\Delta d$) between the first main side of the first foil substrate (10) and the first main side (21) of the second foil substrate (20) caused by the component thickness (D30).

2. Foil-based package (100) comprising:
    a first foil substrate (10) with a first main side (11) and an opposite second main side (12), wherein a multitude of electrical contact elements (5) are arranged on the first main side (11), wherein each contact element (5) comprises a first contact portion (5*a*) and a second contact portion (5*b*) laterally spaced apart therefrom, wherein the first and second contact portions (5*a*, 5*b*) of a contact element (5) are each galvanically connected to each other, and
    a second foil substrate (20) with a first main side (21) and an opposite second main side (22), wherein the second foil substrate (20) comprises a first foil thickness (D20) to be measured between the first and second main sides (21, 22),
    wherein the second foil substrate (20) comprises on its main side (21) a cavity (59) extending towards the second main side (22) such that the second foil substrate (20) has a second foil thickness (D20$_{red}$) there that is reduced compared to the first foil thickness (D20),
    an electronic component (30) comprising a component terminal side (31) having arranged thereon a multitude of component terminal pads (33) for electrically contacting the component (30),
    wherein the first foil substrate (10) and the second foil substrate (20) are arranged on top of each other such that the first main side (11) of the first foil substrate (10) and the second main side (21) of the second foil substrate (20) are opposite to each other,
    wherein the electronic component (30) is arranged between the first foil substrate (10) and the second foil substrate (20) within the cavity (50) such that at least some of the multitude of the component terminal pads (33) are connected to a respective first contact portion (5*a*) of the contact elements (5) arranged on the first main side (11) of the first foil substrate (10), and
    wherein a respective second contact portion (5*b*) of the contact elements (5) connected to the component terminal pads (33) is galvanically connected to a respective one of a multitude of externally-arranged package terminal pads (40) for electrically contacting the foil-based package (100).

3. Foil-based package (100), comprising:
    a first foil substrate (10) with a first main side (11) and an opposite second main side (12), wherein a multitude of electrical contact elements (5) are arranged on the first main side (11), wherein each contact element (5) comprises a first contact portion (5*a*) and a second contact portion (5*b*) laterally spaced apart therefrom, wherein the first and second contact portions (5*a*, 5*b*) of a contact element (5) are each galvanically connected to each other,
    a second foil substrate (20) with a first main side (21) and an opposite second main side (22),
    an electronic component (30) comprising a component terminal side (31) having arranged thereon a multitude of component terminal pads (33) for electrically contacting the component (30),
    wherein the first foil substrate (10) and the second foil substrate (20) are arranged on top of each other such that the first main side (11) of the first foil substrate (10) and the second main side (21) of the second foil substrate (20) are opposite to each other,
    wherein the electronic component (30) is arranged between the first foil substrate (10) and the second foil substrate (20) such that at least some of the multitude of the component terminal pads (33) are connected to a respective first contact portion (5*a*) of the contact elements (5) arranged on the first main side (11) of the first foil substrate (10), and such that the component (30) contacts the first main side (21) of the second foil substrate (20) with its component surface (32) opposite to the component terminal side (31),
    wherein the foil-based package (100) comprises at least two spacer elements (60) arranged between the first and second foil substrates (10, 20), wherein the spacer elements (60) each contact the first main side (11) of the first foil substrate (10) and the first main side (21) of the second foil substrate (20) and are configured to provide a uniform distance (d) between the first main side (11) of the first foil substrate (10) and the first main side (21) of the second foil substrate (20).

4. Package (100) consisting of two flexible foils (10, 20) with conductor paths (5), hermetically enclosing a thin semi-conductor chip (30) and ensuring an electrical connection between the semi-conductor chip (30) and outer contact faces (40), characterized in that the metallization of the contact faces in at least one of the foils (10, 20) is reinforced such that the added metal heights in the z direction at least correspond to the thickness of the semi-conductor component (30) including the bumps (33).

5. Package (100) consisting of two flexible foils (10, 20) having conductor paths (5), hermetically enclosing a thin semi-conductor chip (30) and ensuring an electrical connection between the semi-conductor chip (30) and outer contact faces (40), characterized in that a recess (50) whose dimension in the x, y and z directions at least correspond to the dimensions of the semi-conductor component (30) including the bumps (33) is introduced into one of the foils (10, 20) in a subtractive manner.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A foil package, comprising:
a first foil substrate comprising a first main side and an opposite second main side, wherein electrical contact elements are arranged on the first main side, wherein each of the electrical contact elements comprises a first contact portion and an opposite second contact portion, wherein the first and second contact portions are galvanically connected to each other by a connecting portion,
a second foil substrate comprising a first main side and an opposite second main side,
an electronic component comprising a first component side and an opposite second component side, wherein component terminal pads for electrically contacting the electronic component are arranged on the first component side, and wherein the electronic component comprises a thickness to be measured between the first and second component sides,
wherein the first foil substrate and the second foil substrate are arranged on top of each other such that the first main side of the first foil substrate and the first main side of the second foil substrate are opposite to each other,
wherein the electronic component is arranged between the first foil substrate and the second foil substrate such that the component terminal pads are connected to the first contact portions of the electrical contact elements that are arranged on the first main side of the first foil substrate,
wherein the second contact portions of the electrical contact elements are connected to package terminal pads being provided at an exterior of the foil package for electrically contacting the foil package, and
wherein the foil package comprises a cavity provided in the second foil substrate, said cavity for reducing or compensating a distance difference between the first foil substrate and the second foil substrate caused by the thickness of the electronic component,
wherein the second foil substrate comprises a thickness to be measured between its first and second main sides,
wherein the cavity is formed by removing a foil substrate material of the second foil substrate, such that the cavity extends into the second foil substrate, from its first main side towards its second main side, such that the second foil substrate comprises a reduced thickness at a location where the cavity is formed, and
wherein the electronic component is arranged within said cavity.

2. The foil package according to claim 1,
wherein the package terminal pads are arranged at the second main side of the first foil substrate,
wherein a galvanic connection is provided between the second contact portions and the package terminal pads by means of a via extending through the first foil substrate, and
wherein the electronic component is contactable from the exterior of the foil package, at the second main side of the first foil substrate.

3. The foil package according to claim 2,
wherein the arrangement as claimed in claim 2 results in a signal path to be traversed in the following order; starting from the component terminal pads, via the first contact portions, via the connecting portions connecting the first and second contact portions, via the second contact portions, and via a galvanic connection connected to the second contact portions and extending through the first foil substrate, finally ending at the package terminal pads that are provided at the exterior of the foil package and that are connected to said galvanic connection.

4. The foil package according to claim 1,
wherein the package terminal pads are arranged at the second main side of the second foil substrate,
wherein a galvanic connection is realized between the second contact portions and the package terminal pads by means of a via extending through the second foil substrate, and
wherein the electronic component is contactable from the exterior of the foil package, at the second main side of the second foil substrate.

5. The foil package according to claim 4,
wherein the arrangement as claimed in claim 4 results in a signal path to be traversed in the following order; starting from the component terminal pads, via the first contact portions, via the connecting portions connecting the first and second contact portions, via the second contact portions, and via the galvanic connection connected to the second contact portions and extending through the second foil substrate, finally ending at the package terminal pads that are provided at the exterior of the foil package and that are connected to said galvanic connection.

6. The foil package according to claim 1,
wherein the cavity comprises a depth to be measured between the first and second main sides of the second foil substrate, and wherein the depth of the cavity is larger than or equal to the thickness of the electronic component arranged in the cavity.

7. The foil package according to claim 1,
wherein the thickness of the second foil substrate is smaller than or equal to 130 µm, and
wherein the thickness of the electronic component is smaller than or equal to 60 µm.

8. The foil package according to claim 1,
wherein the first foil substrate comprises a thickness to be measured between its first and second main sides, and
wherein the reduced thickness of the second foil substrate is as large as the thickness of the first foil substrate.

9. The foil package according to claim 1,
wherein the cavity is dimensioned such that, despite the electronic component being arranged between the first and second foil substrates, the second main side of the first foil substrate and/or the second main side of the second foil substrate each comprise a flat surface.

10. The foil package according to claim 1,
wherein the cavity is dimensioned such that the first and/or the second foil substrate do not comprise a deformation caused by the thickness of the electronic component.

11. The foil package according to claim 1,
wherein a metallization for electrically shielding the electronic component and/or for heat dissipation of a heat radiation originating from the electronic component is arranged on the second main side of the first foil substrate opposite to the electronic component and/or on the second main side of the second foil substrate opposite to the electronic component.

12. The foil package according to claim 1,
wherein the foil package comprises an overall thickness to be measured between the second main side of the first foil substrate and the second main side of the second foil substrate, the overall thickness being smaller than or equal to 250 µm.

\* \* \* \* \*